United States Patent
Kariya et al.

(10) Patent No.: US 8,692,216 B2
(45) Date of Patent: Apr. 8, 2014

(54) ION IMPLANTATION APPARATUS AND CONTROL METHOD THEREOF

(71) Applicant: Sen Corporation, Tokyo (JP)

(72) Inventors: Hiroyuki Kariya, Tokyo (JP); Masaki Ishikawa, Tokyo (JP); Yoshiaki Inda, Tokyo (JP); Takeshi Kurose, Tokyo (JP); Takanori Yagita, Tokyo (JP); Toshio Yumiyama, Tokyo (JP)

(73) Assignee: Sen Corporation, Tokyo (JP)

( * ) Notice: Subject to any disclaimer, the term of this patent is extended or adjusted under 35 U.S.C. 154(b) by 0 days.

(21) Appl. No.: 13/839,753

(22) Filed: Mar. 15, 2013

(65) Prior Publication Data

US 2013/0256566 A1 Oct. 3, 2013

(30) Foreign Application Priority Data

Mar. 29, 2012 (JP) .................................. 2012-077101

(51) Int. Cl.
*H01J 37/147* (2006.01)
*H01L 21/265* (2006.01)
*H01J 37/317* (2006.01)

(52) U.S. Cl.
CPC ........... *H01J 37/3171* (2013.01); *H01J 37/147* (2013.01); *H01L 21/265* (2013.01)
USPC ................... 250/492.21; 250/492.2; 250/397; 250/396 ML; 250/492.3; 250/423 R

(58) Field of Classification Search
CPC .................. H01J 37/3171; H01J 2237/24542; H01J 2237/31703; H01J 2237/31701; H01J 2237/083; H01J 2237/20228; H01J 2237/24405; H01J 2237/30483; H01J 2237/0835; H01J 2237/1503; H01J 37/147; H01L 21/265
USPC .......... 250/492.21, 492.2, 397, 492.3, 423 R, 250/396 ML
See application file for complete search history.

(56) References Cited

U.S. PATENT DOCUMENTS

| | | | | |
|---|---|---|---|---|
| 5,811,823 A * | 9/1998 | Blake et al. | ............... | 250/492.21 |
| 7,189,980 B2 * | 3/2007 | Mollica | .................. | 250/492.21 |
| 7,253,423 B2 * | 8/2007 | Chang et al. | ............. | 250/492.21 |
| 7,326,941 B2 * | 2/2008 | Chen et al. | ............... | 250/492.21 |
| 7,351,987 B2 * | 4/2008 | Kabasawa et al. | ........ | 250/492.21 |

(Continued)

FOREIGN PATENT DOCUMENTS

| | | |
|---|---|---|
| JP | 7169431 A | 7/1995 |
| JP | 10116581 A | 5/1998 |
| JP | 3153784 | 1/2001 |
| JP | 3257205 B2 | 12/2001 |

*Primary Examiner* — David A Vanore
(74) *Attorney, Agent, or Firm* — Arent Fox LLP

(57) ABSTRACT

A vertical profile, a horizontal profile, and an integrated current value of an ion beam are measured by a plurality of stationary beam measuring instruments and a movable or stationary beam measuring device. At a beam current adjustment stage before ion implantation, a control device simultaneously performs at least one of adjustment of a beam current to a preset value of the beam current, adjustment of a horizontal beam size that is necessary to secure uniformity of the horizontal ion beam density, and adjustment of a vertical beam size that is necessary to secure the uniformity of the vertical ion implantation distribution on the basis of a measurement value of the stationary beam measuring instruments and the movable or stationary beam measuring device.

34 Claims, 14 Drawing Sheets

(56) References Cited

U.S. PATENT DOCUMENTS

| | | | |
|---|---|---|---|
| 7,355,188 B2 * | 4/2008 | Olson et al. | 250/492.21 |
| 7,417,242 B2 * | 8/2008 | Ray | 250/492.21 |
| 7,442,944 B2 * | 10/2008 | Chang et al. | 250/492.21 |
| 7,462,843 B2 * | 12/2008 | Chen et al. | 250/492.21 |
| 7,586,111 B2 * | 9/2009 | Sieradzki et al. | 250/492.21 |
| 7,755,067 B2 * | 7/2010 | Tsukihara et al. | 250/492.21 |
| 7,851,772 B2 * | 12/2010 | Tsukihara et al. | 250/492.21 |
| 7,902,527 B2 * | 3/2011 | Chen et al. | 250/492.21 |
| 7,964,856 B2 * | 6/2011 | Nakamoto et al. | 250/492.23 |
| 2013/0146760 A1 * | 6/2013 | Eisner et al. | 250/288 |

* cited by examiner

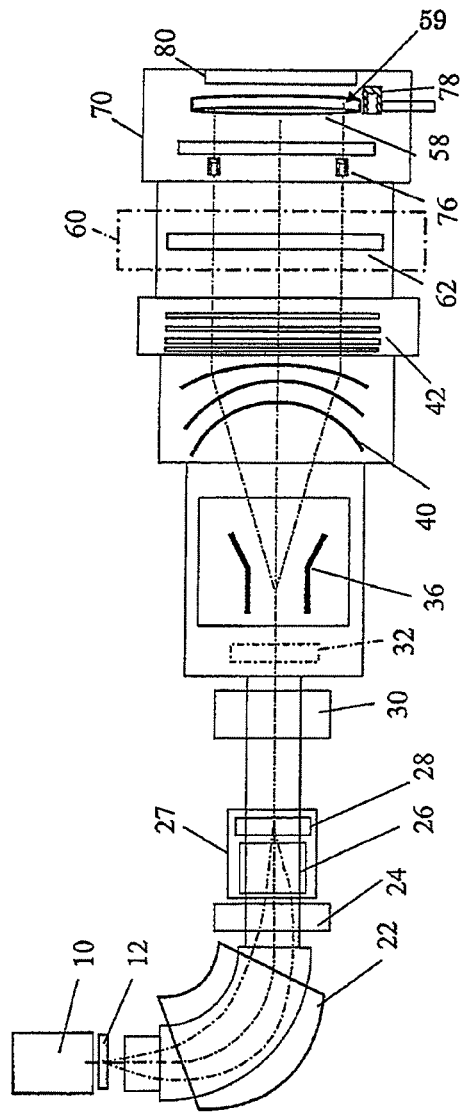
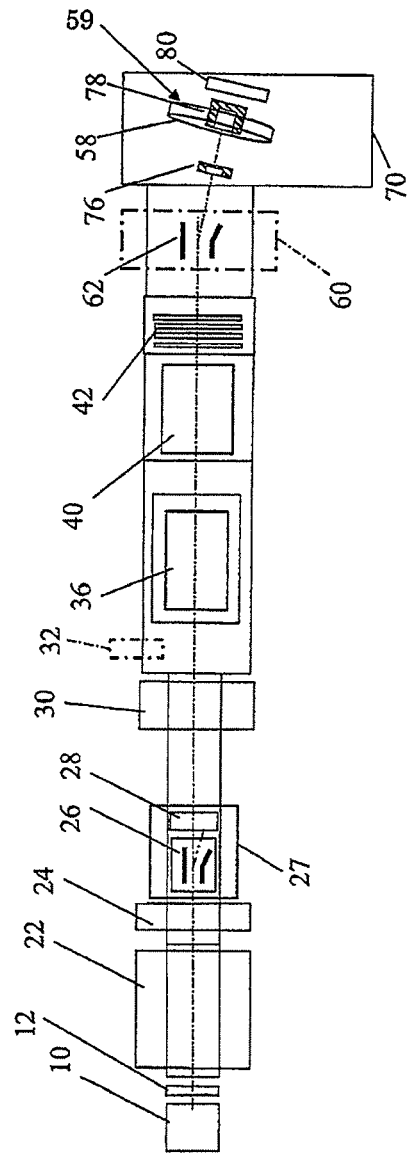
FIG. 1A
FIG. 1B

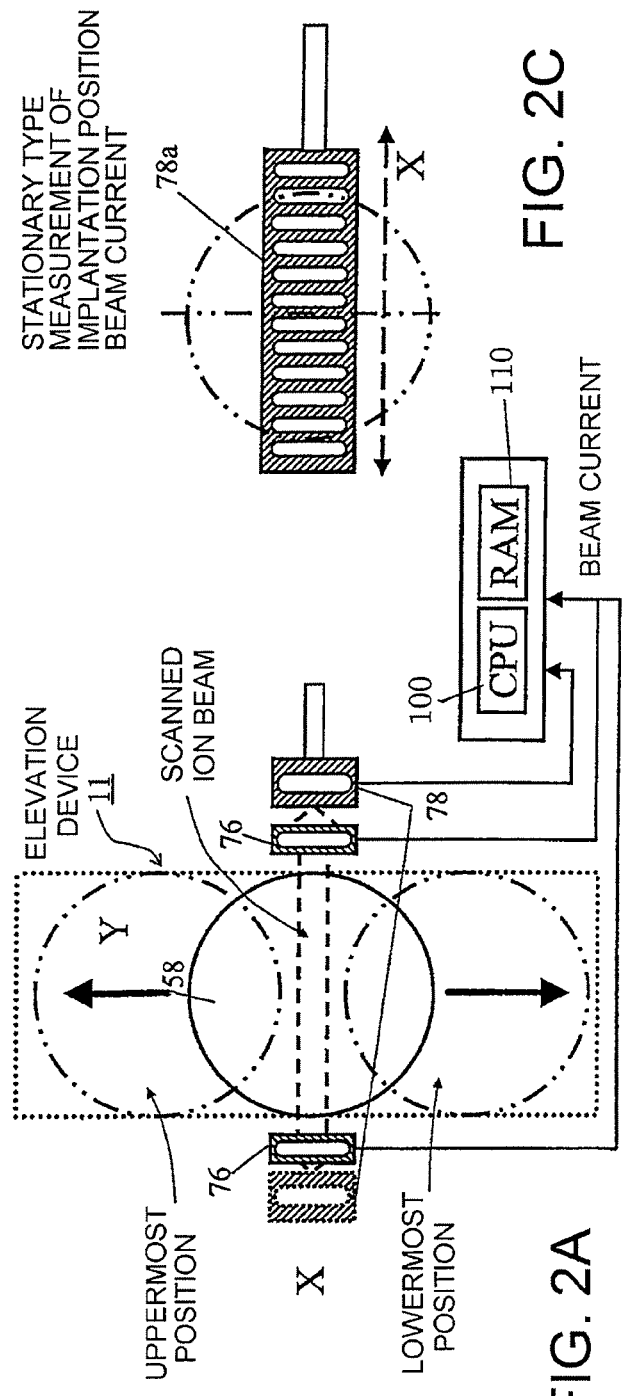
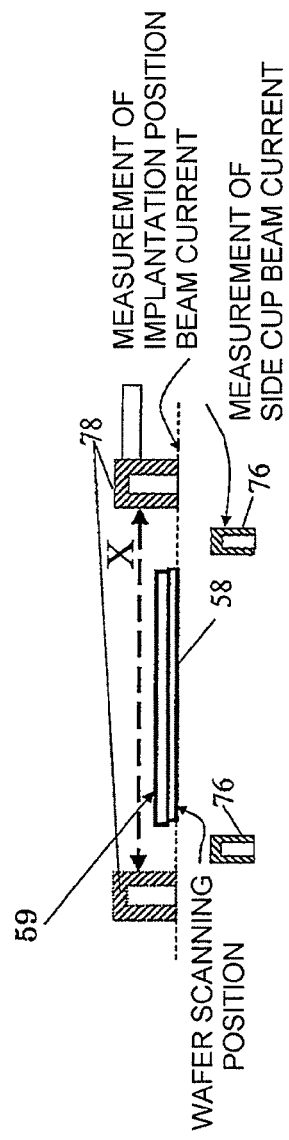

ION IMPLANTATION APPARATUS AND CONTROL METHOD THEREOF

This application is based upon and claims the benefit of priority from Japanese Patent Application No. 2012-77101, filed on Mar. 29, 2012, the disclosure of which is incorporated herein in its entirety by reference.

BACKGROUND OF THE INVENTION

1. Field of the Invention

The present invention relates to an ion implantation apparatus that is capable of implanting an ion beam extracted from an ion source into a wafer, and a control method thereof.

2. Description of Related Art

In general, an ion implantation apparatus has a configuration in which an ion source, an extraction electrode, a mass-analyzing magnet unit, a mass-analyzing slit, a beam scanner, a beam parallelizing device, an acceleration and deceleration device, an angular energy filter (AEF) device, a wafer processing chamber, a beam measuring device, and the like are disposed along a beam line. The ion implantation apparatus is used to implant ions into a wafer that is a semiconductor substrate using an ion beam extracted from the ion source.

Commonly, there are various beam measuring devices and methods suggested for measuring an amount of a beam current of the scanned ion beam that is parallelized after scanning a wafer in a reciprocation manner with the ion beam by a beam scanner, and a vertical (Y direction) profile and a horizontal (X direction) profile of the beam. The X direction and Y direction have the same meaning as an X-axis direction and a Y-axis direction, respectively.

There is disclosed a hybrid-type ion implantation apparatus in which a wafer is scanned with an ion beam in a reciprocating manner (may be called first scanning, beam scanning, or X-scanning) by a beam scanner with regard to an one-axis direction, for example, a horizontal direction, and the wafer is made to move in a reciprocating manner (may be called slow scanning or mechanical Y-scanning) by a mechanical Y-scanning device in a direction orthogonal to the one-axis direction, for example, in a vertical direction. In this ion implantation apparatus, as an example of a beam measurement and beam current control method, a method using measurement by a movable Faraday cup and beam scanning control by a beam deflection device is suggested (Japanese Patent No. 3153784). In the beam current control method using the beam measurement and the beam scanning control, a beam current of the scanned ion beam that is incident to the Faraday cup is measured while moving the Faraday cup along a scanning route of the scanned ion beam, and then the adjusted ion beam is measured at one side of an ion implantation position that is a wafer holding position at which ion implantation is performed. Here, the one side of the ion implantation position represents one side of two divided ion implantation regions, which are divided into two parts along the diameter of the wafer parallel in a Y-direction, in an ion implantation region of the wafer.

In the beam current control method using the beam measurement and the scanning control, before initiation of ion implantation, the beam current of the scanned ion beam that is incident to the Faraday cup is measured while moving the movable Faraday cup along the scanning route of the ion beam at an arbitrary position on a beam line, and then an amount of beam current of the adjusted ion beam is measured by a one-side beam current measuring instrument that is disposed at one side of the ion implantation position. The amount of the beam current is measured by only the one-side beam current measuring instrument. The movable Faraday cup does not perform measurement of a horizontal (X-direction) profile of the scanned ion beam (and a vertical (Y-direction) profile of the scanned ion beam).

In addition, in the above-described beam current control method, the scanned ion beam is measured by the movable Faraday cup and the one side beam current measuring instrument that is disposed in a stationary manner at the one side of the ion implantation position. However, in the above-described beam current control method, since the one side beam current measuring instrument is disposed in a stationary manner, it is impossible to perform beam measurement at a position on a side opposite to the one side of the ion implantation position, and beam measurement within a scanning range of the ion implantation position. Therefore, the beam current control using the beam measurement and the scanning control may be limited, and thus this limitation becomes a cause of obstruction to the request for measurement with high precision.

Therefore, as an example of the beam measurement method for improving the precision of the beam measurement and the beam current control, there is suggested a method in which in a beam scanning range between both scanning side positions in front of (upstream side) a wafer supporting platen that is the ion implantation position, and the rearmost position of the beam line behind the wafer supporting platen, the ion beam that is incident to this beam scanning range is measured by a Faraday cup disposed in a stationary manner (Japanese Patent No. 3257205).

The beam measurement method of Japanese Patent No. 3153784 has a configuration that a scanned ion beam is measured by a movable Faraday cup and a one-side beam current measuring instrument that is disposed in a stationary manner disposed at one side of the ion implantation position. However, in this beam measurement method, it is impossible to perform beam measurement at a position on a side opposite to the one side of the ion implantation position, and beam measurement within the scanning range of the ion implantation position. Therefore, the beam measurement may be limited, and thus this limitation becomes a cause of obstruction to the request for the high precision of the beam current control using the beam measurement and the scanning control.

On the other hand, the method disclosed in Japanese Patent No. 3257205 is a method of performing the beam measurement within the beam scanning range between both scanning side positions in front of the wafer supporting platen that is the ion implantation position, and the rearmost position of the beam line behind the wafer supporting platen. This method does not consider performing measurement of an ion beam, which is incident to the Faraday cup at an ion implantation position on the beam line and positions immediately in front of or behind the ion implantation position, by using the Faraday cup. Therefore, Japanese Patent No. 3257205 may not be applied to Japanese Patent No. 3153784.

In addition, in the method disclosed in Japanese Patent No. 3257205, measurement of a degree of uniformity of ion beam density in a horizontal direction, measurement of the total amount of the beam current, and measurement of the horizontal (X-direction) profile of the beam (and the vertical (Y-direction) profile of the beam) are reasonably set, and the adjustment of the ion beam is performed. Therefore, it is necessary for the method to be carried out to realize comprehensively optimized beam control.

In the hybrid-type ion implantation apparatus, a method of making a horizontal ion beam density distribution of the scanned ion beam in the first scanning direction (horizontal direction) uniform is disclosed, for example, in Japanese Patent No. 3153784. This method assumes a variation in a horizontal spot size of the beam to a certain amount, but does not assume expansion of the beam size such things as the beam remains on a target even at both ends of the beam scanning.

FIG. 10 illustrates an ion beam density distribution in a case where a beam size is small, and FIG. 11 illustrates an ion beam density distribution in a case where an ion beam is not swept away from the target at both ends of scanning when the beam size increases.

On the other hand, with regard to a beam tuning that is carried out before the uniformalizing of the horizontal ion beam density distribution of the scanned ion beam, when simple tuning is performed by only increasing a beam current value, the beam current may be increased, but the horizontal (X-direction) ion beam density distribution of the beam at the ion implantation position varies, and thus the beam size may be expanded.

In a case of an electrostatic beam scanner, the uniformalizing of the horizontal ion beam density distribution of the scanned ion beam is carried out by correcting (increasing or decreasing) a gradient $dV/dt$ of an applied voltage of an alternating electric field (typically triangle wave) that is applied, but the correction does not operate well when the ion beam is not swept away from the target at both ends of scanning, and the horizontal ion beam density distribution of the scanned ion beam may not be uniformalized. This is because the beam current value at ends of the scanning range is determined by a factor other than original beam current intensity, and thus there is a contradiction to the correction itself of the gradient $dV/dt$ of the applied voltage of the alternating electric field at that position.

To solve this problem, in the beam turning that is carried out before the uniformalizing of the scanned ion beam, it is necessary to tune both of the beam current value and the horizontal ion beam density distribution of a stationary beam at the same time by monitoring the horizontal distribution (horizontal stationary profile) of the stationary beam other than the beam current value.

To measure a horizontal (X-direction) stationary profile of the stationary beam, a Faraday cup having a thin slit that is long in the Y-direction is used, and it is necessary to perform the measurement by mechanically moving the Faraday cup in the X-direction. In a case of a hybrid-type ion implantation apparatus that performs electrostatic scanning by a beam scanner in the X-direction of the beam and mechanical Y-scanning in the Y-direction of the beam, for measurement of the horizontal stationary profile of the beam, it is necessary to obtain the horizontal stationary profile of the beam by moving the Faraday cup in the X-direction after stopping the electrostatic scanning of the beam, and by measuring stationary beam intensity distribution at each point in the X-direction.

However, in this method, a measurement time of one point is restricted by a mechanical movement time of the Faraday cup, and thus an increase in speed of the measurement is limited. Therefore, the method is not realistic for monitoring that is carried out for the tuning of the ion implantation apparatus in which an increase in speed is demanded.

In addition, with regard to parameter tuning, in a case where a response to be optimized is composed of a mono-variable, the parameter may be made to vary in order for the mono-variable to be a desired value. However, in a case where the response is composed of multi-variables, it is necessary to compose these variables and convert into one variable.

Consideration may be made for a hybrid-type ion implantation apparatus in which reciprocating scanning by the ion beam is performed by the beam scanner in one axis direction, for example, in the horizontal direction with an arbitrary first scanning frequency (beam scanning (first scanning) speed), and a wafer is made to move in a reciprocating manner by a mechanical Y-scanning device in a direction orthogonal to the one axis direction, for example, in the vertical direction with an arbitrary slow scanning frequency (a wafer scanning speed or a vertical scanning speed). In this hybrid-type ion implantation apparatus, in a case where a reciprocating scanning frequency of the beam is set to be variable, and the beam scanning speed of the reciprocating scanning is changed, particularly, in a case of using a slow beam scanning speed on a low frequency side, as shown in FIGS. 12A and 12B, when the first scanning frequency (beam scanning speed) closes to the slow scanning frequency (wafer scanning speed) and a beam size in the Y-direction decreases, a vertical beam overlapping width (overlapping amount) varies by the beam scanning of respective cycles, and thus the ion implantation distribution unevenness occurs in the vertical direction with respect to the wafer (target substrate). Therefore, the uniformity in a vertical ion implantation distribution deteriorates.

To solve this problem, in the beam turning that is carried out before the uniformalizing of the scanned ion beam, it is necessary to increase the Y-direction (vertical direction) beam size in order for the vertical ion implantation distribution to be uniform by monitoring the vertical ion beam stationary density (vertical profile) of the stationary beam according to X-direction (horizontal direction) and Y-direction (vertical direction) scanning frequencies other than the beam current value.

SUMMARY OF INVENTION

The present invention has been made in consideration of the above-described circumstances, and aims to realize an ion implantation apparatus in which tuning is easy, and a control method thereof.

The present invention is applied to an ion beam scanning processing apparatus which is configured in such a manner that an ion beam extracted from an ion source by an extraction electrode is made to pass through a beam line reaching a wafer, in which a mass-analyzing magnet unit, a mass-analyzing slit, a beam scanner, a beam parallelizing device, a wafer processing chamber, and a wafer mechanical scanning device (a mechanical Y-scanning device) are disposed along the beam line, and which is provided with a side cup current measuring instrument (stationary beam measuring instrument) that measures the ion beam, and a movable or stationary implantation position beam current measuring device (movable or stationary beam measuring device) at a section of the beam line in front of and in the vicinity of the wafer.

The present invention may have the following configurations.

(Configuration 1)

According to an embodiment of the invention, there is provided a hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is mechanically moved at a mechanical scanning speed in a vertical direction orthogonal to the horizontal direction, and the mechanical scanning speed is controlled by real time beam measurement feedback to secure uniformity of a vertical ion implantation distribution in the wafer.

A vertical profile, a horizontal profile and an integrated current value of the ion beam are measured by a plurality of stationary beam measuring instruments and a movable or stationary beam measuring device.

The hybrid-type ion implantation apparatus comprises a control device that simultaneously performs, at a beam current adjustment stage before ion implantation, adjustment of a beam current to a preset value of the beam current (a preset value that is set in advance), and adjustment of a horizontal beam size that is necessary to secure the uniformity of the horizontal ion beam density distribution, on the basis of a measurement value of the stationary beam measuring instruments and the movable or stationary beam measuring device.

(Configuration 2)

In the hybrid-type ion implantation apparatus according to Configuration 1, the simultaneous adjustment of the adjustment of a beam current to the preset value of the beam current and the adjustment of the horizontal beam size by the control device may be simultaneous adjustment in which priority is given to the adjustment of a beam current to the preset value of the beam current.

(Configuration 3)

In the hybrid-type ion implantation apparatus according to Configuration 1, the simultaneous adjustment of the adjustment of a beam current to the preset value of the beam current and the adjustment of the horizontal beam size by the control device may be simultaneous adjustment in which priority is given to the adjustment of the horizontal beam size.

(Configuration 4)

According to another embodiment of the invention, there is provided a hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is moved at a mechanical scanning speed in a vertical direction orthogonal to a beam scanning direction, and the mechanical scanning speed is controlled by real time beam measurement feedback to secure uniformity of a vertical ion implantation distribution in the wafer.

A vertical profile, a horizontal profile, and an integrated current value of the ion beam are measured by a plurality of stationary beam measuring instruments and a movable or stationary beam measuring device.

The hybrid-type ion implantation apparatus comprises a control device that simultaneously performs, at a beam current adjustment stage before ion implantation, adjustment of a beam current to the preset value of the beam current, and adjustment of a vertical beam profile, on the basis of a measurement value of the stationary beam measuring instruments and the movable or stationary beam measuring device.

(Configuration 5)

In the hybrid-type ion implantation apparatus according to Configuration 4, the control device may perform adjustment of a vertical beam size that is necessary to secure the uniformity of the vertical ion implantation distribution in the wafer as the adjustment of the vertical beam profile.

(Configuration 6)

In the hybrid-type ion implantation apparatus according to Configuration 5, the control device may simultaneously perform, at the beam current adjustment stage before the ion implantation, according to a scanning frequency of the beam scanner and on the basis of the measurement value of the stationary beam measuring instruments and the movable or stationary beam measuring device, the adjustment of a beam current to the preset value of the beam current and the adjustment of the vertical beam size that is necessary to secure the uniformity of the vertical ion implantation distribution.

(Configuration 7)

In the hybrid-type ion implantation apparatus according to Configuration 5, the control device may simultaneously perform, at the beam current adjustment stage before the ion implantation, according to the mechanical scanning speed and on the basis of the measurement value of the stationary beam measuring instruments and the movable or stationary beam measuring device, the adjustment of a beam current to the preset value of the beam current and the adjustment of the vertical beam size that is necessary to secure the uniformity of the vertical ion implantation distribution.

(Configuration 8)

In the hybrid-type ion implantation apparatus according to Configuration 5, the control device may simultaneously perform, at the beam current adjustment stage before the ion implantation, according to a scanning frequency of the beam scanner and the mechanical scanning speed and on the basis of the measurement value of the stationary beam measuring instruments and the movable or stationary beam measuring device, the adjustment of a beam current to the preset value of the beam current and the adjustment of the vertical beam size that is necessary to secure the uniformity of the vertical ion implantation distribution.

(Configuration 9)

According to still another embodiment of the invention, there is provided a hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is moved at a mechanical scanning speed in a vertical direction orthogonal to a beam scanning direction, and the mechanical scanning speed is controlled by real time beam measurement feedback to secure uniformity of a vertical ion implantation distribution in the wafer.

A vertical profile, a horizontal profile, and an integrated current value of the ion beam are measured by a plurality of stationary beam measuring instruments and a movable or stationary beam measuring device.

The hybrid-type ion implantation apparatus comprises a control device that simultaneously performs, at a beam current adjustment stage before ion implantation, adjustment of a beam current to the preset value of the beam current, adjustment of a horizontal beam size that is necessary to secure the uniformity of the horizontal ion beam density distribution, and adjustment of a vertical beam profile, on the basis of a measurement value of the stationary beam measuring instruments and the movable or stationary beam measuring device.

(Configuration 10)

In the hybrid-type ion implantation apparatus according to Configuration 9, the control device may perform adjustment of a vertical beam size that is necessary to secure the uniformity of the vertical ion implantation distribution in the wafer as the adjustment of the vertical beam profile.

(Configuration 11)

In the hybrid-type ion implantation apparatus according to Configuration 9, the control device may simultaneously perform the adjustment of a beam current to the preset value of the beam current, the adjustment of the horizontal beam size that is necessary to secure the uniformity of the horizontal ion beam density distribution, and adjustment of a vertical beam size that is necessary to secure the uniformity of the vertical ion implantation distribution in the wafer as the adjustment of the vertical beam profile.

(Configuration 12)

In the hybrid-type ion implantation apparatus according to any one of Configurations 1 to 11, at least one stationary beam measuring instrument among the plurality of stationary beam measuring instruments may be a side cup current measuring instrument that is provided in front of or behind an ion implantation position on a beam line on a lateral side of the beam line.

(Configuration 13)

In the hybrid-type ion implantation apparatus according to any one of Configurations 1 to 12, the movable or stationary beam measuring device may be an implantation position beam measuring device that is provided at an ion implantation position.

(Configuration 14)

In the hybrid-type ion implantation apparatus according to any one of Configurations 1 to 13, the control device may perform the control of the beam current and the beam profile by introducing an individual desirability value and a composed desirability value.

(Configuration 15)

In the hybrid-type ion implantation apparatus according to any one of Configurations 1 to 14, a tuning Faraday cup, which has a function of measuring the entirety of beam currents and measures a final set-up beam at a position behind the ion implantation position, may be disposed at the most downstream of a beam line.

The control device may monitor beam waveprofile and beam current signals supplied from the stationary beam measuring instruments, beam waveprofile and beam current signals supplied from the movable or stationary beam measuring device, and beam current signals obtained from the tuning Faraday cup as a reference, convert these signals (variables) into one variable using a function of a composed desirability value, and perform parameter tuning.

(Configuration 16)

In the hybrid-type ion implantation apparatus according to Configuration 14, the control device may generate a calculation expression in order for all variables to satisfy a specified limit when the composed desirability value becomes a set value.

(Configuration 17)

In the hybrid-type ion implantation apparatus according to Configuration 15, the control device may prepare a plurality of the composed desirability values in accordance with characteristics of a parameter that is subjected to the tuning.

(Configuration 18)

In the hybrid-type ion implantation apparatus according to any one of Configurations 15 to 17, the control device may be configured to fetch a beam waveprofile that is supplied from the stationary beam measuring instruments and a beam waveprofile that is supplied from the movable or stationary beam measuring device through an AD converter.

The AD converter may convert waveprofile data row (t0, l0), (t1, l1), ..., (tn, ln) with a type of beam intensity li (i is 0 and a positive integer) at an arbitrary time ti into numerical data that is used for a tuning control, and output the numerical data to the control device.

(Configuration 19)

In the hybrid-type ion implantation apparatus according to Configuration 18, the AD converter may perform the conversion of the waveprofile data into numerical data with respect to a beam width that is m % (m is a value determined in advance) of a total integrated value of beam intensity, beam peak intensity, the total integrated value of beam intensity, and a standard deviation of a beam intensity distribution.

(Configuration 20)

In the hybrid-type ion implantation apparatus according to any one of Configurations 14 to 19, when taking one response to be optimized at the horizontal axis, the control device may set an upper limit standard value and a lower limit standard value that satisfy the response, and set the individual desirability value to a trapezoidal function form in order for the individual desirability value to be a set value when the response enters between the upper limit standard value and the lower limit standard value.

(Configuration 21)

In the hybrid-type ion implantation apparatus according to Configuration 20, the control device may use the following expression as a composed desirability value D.

$D = \alpha_1 \cdot d_1^{\beta_1} + \alpha_2 \cdot d_2^{\beta_2} + \ldots + \alpha_n \cdot d_n^{\beta_n}$, where $\beta n$ represents a coefficient indicating strictness with respect to the upper limit standard value and the lower limit standard value, $\alpha_n$ represents a weight of the individual desirability value, and weight $\alpha$ is set to satisfy the following Expression (1).

$$\sum_{i=1}^{n} \alpha_i = 1 \tag{1}$$

(Configuration 22)

In the hybrid-type ion implantation apparatus according to Configuration 21, when a value of the composed desirability value D becomes a set value, the control device may determine that all responses enter within the upper limit standard value and the lower limit standard value, and complete the tuning.

(Configuration 23)

In the hybrid-type ion implantation apparatus according to Configuration 18 or 19, the control device may process the beam waveprofile data, which is fetched through the AD converter, by a tracking task that simultaneously performs a plurality of input controls.

(Configuration 24)

In the hybrid-type ion implantation apparatus according to Configuration 23, in the tracking task, the control device may perform calculation of the composed desirability value using a calculation expression that is determined in advance, and set a calculation result in a table capable of being referenced commonly in the control device.

(Configuration 25)

In the hybrid-type ion implantation apparatus according to any one of Configurations 14 to 24, the control device may be configured to obtain a desirably optimized beam with respect to a set target value by tuning a value of each element of various device parameters in order for one variable value that is set to be maximum.

(Configuration 26)

In the hybrid-type ion implantation apparatus according to Configuration 25, in the ion source, the values of the elements of various device parameters may be values of a gas flow rate, an arc current, a filament current, an arc voltage, a cathode voltage, and a cathode current that are adjustment factors of plasma and thermal electrons.

(Configuration 27)

In the hybrid-type ion implantation apparatus according to Configuration 25, in each element of the beam line downstream the ion source, the values of the elements of various device parameters may be values of a position of an extraction electrode that extracts the ion beam from the ion source, and respective currents or voltages of the mass-analyzing magnet unit, an X-steerer, a beam focusing lens, the beam scanner, a beam parallelizing lens, an acceleration and deceleration device, an angular energy filter, and other electrodes.

(Configuration 28)

In the hybrid-type ion implantation apparatus according to Configuration 12, at least one stationary beam measuring instrument among the plurality of stationary beam measuring instruments may be a side cup current measuring instrument that measures an integrated current value.

(Configuration 29)

In the hybrid-type ion implantation apparatus according to Configuration 13, the vertical profile and the horizontal profile of the ion beam may be measured by the implantation position beam measuring device that is the movable or stationary beam measuring device.

(Configuration 30)

In the hybrid-type ion implantation apparatus according to any one of Configurations 1 to 11, at least one stationary beam measuring instrument among the plurality of stationary beam measuring instruments may be constituted by a tuning Faraday cup, which has a function of measuring the entirety of beam currents and measures the scanned ion beam at a position behind the ion implantation position, to measure the integrated current value.

(Configuration 31)

According to still another embodiment of the invention, there is provided a control method of a hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is moved at a mechanical scanning speed in a vertical direction orthogonal to a beam scanning direction, and the mechanical scanning speed is controlled by real time beam measurement feedback to secure uniformity of a vertical ion implantation distribution in the wafer.

A vertical profile, a horizontal profile, and an integrated current value of the ion beam are measured by a plurality of stationary beam measuring instruments and a movable or stationary beam measuring device.

At a beam current adjustment stage before ion implantation, adjustment of a beam current to the preset value of the beam current, and adjustment of a horizontal beam size that is necessary to secure the uniformity of the horizontal ion beam density distribution are simultaneously performed on the basis of a measurement value of the stationary beam measuring instruments and the movable or stationary beam measuring device.

(Configuration 32)

According to still another embodiment of the invention, there is provided a control method of a hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is moved at a mechanical scanning speed in a vertical direction orthogonal to a beam scanning direction, and the mechanical scanning speed is controlled by real time beam measurement feedback to secure uniformity of a vertical ion implantation distribution in the wafer.

A vertical profile, a horizontal profile, and an integrated current value of the ion beam are measured by a plurality of stationary beam measuring instruments and a movable or stationary beam measuring device.

At a beam current adjustment stage before ion implantation, adjustment of a beam current to the preset value of the beam current, and adjustment of a vertical beam profile are simultaneously performed on the basis of a measurement value of the stationary beam measuring instruments and the movable or stationary beam measuring device.

(Configuration 33)

In the hybrid-type ion implantation apparatus according to Configuration 32, adjustment of a vertical beam size that is necessary to secure the uniformity of the vertical ion implantation distribution in the wafer may be performed as the adjustment of the vertical beam profile.

(Configuration 34)

According to still another embodiment of the invention, there is provided a control method of a hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is moved at a mechanical scanning speed in a vertical direction orthogonal to a beam scanning direction, and the mechanical scanning speed is controlled by real time beam measurement feedback to secure uniformity of a vertical ion implantation distribution in the wafer.

A vertical profile, a horizontal profile, and an integrated current value of the ion beam are measured by a plurality of stationary beam measuring instruments and a movable or stationary beam measuring device.

At a beam current adjustment stage before ion implantation, adjustment of a beam current to the preset value of the beam current, adjustment of a horizontal beam size to secure uniformity of the horizontal ion beam density, and adjustment of a vertical beam size to secure the uniformity of the vertical ion implantation distribution are simultaneously performed on the basis of a measurement value of the stationary beam measuring instruments and the movable or stationary beam measuring device.

In the present invention, the movable or stationary beam measuring device is disposed at an arbitrary position of the ion implantation position, and a beam-scanned beam waveprofile is obtained through an AD converter such as an oscilloscope. Accordingly, the beam waveprofile may be measured at a high speed. Beam tuning is performed with both of the measured beam waveprofile and the beam current set as a reference, and thus the beam residual phenomenon does not occur. Not only the amount of the beam current but also spreading of the beam may be simultaneously tuned, and thus both of these may be tuned with high reproducibility.

According to the present invention, since not only the amount of the beam current but also the spreading of the beam is simultaneously tuned, the adjustment of the horizontal beam size that is necessary to secure the uniformity of the horizontal ion beam density distribution of the beam, and the adjustment of the vertical beam size that is necessary to secure the uniformity of the vertical ion implantation distribution may be simultaneously performed within a short time. Furthermore, both of these may be tuned with high reproducibility, and thus an ion implantation apparatus in which tuning is easy, and a control method thereof may be provided.

BRIEF DESCRIPTION OF THE DRAWINGS

FIGS. 1A and 1B are views illustrating a schematic configuration of an example of an ion implantation apparatus to which the present invention is applied, in which FIG. 1A is a plan view and FIG. 1B is a side view;

FIGS. 2A to 2C are views illustrating a configuration example of a control system configured to realize an ion beam scanning processing by the present invention;

DETAILED DESCRIPTION OF THE INVENTION

Figure 3:
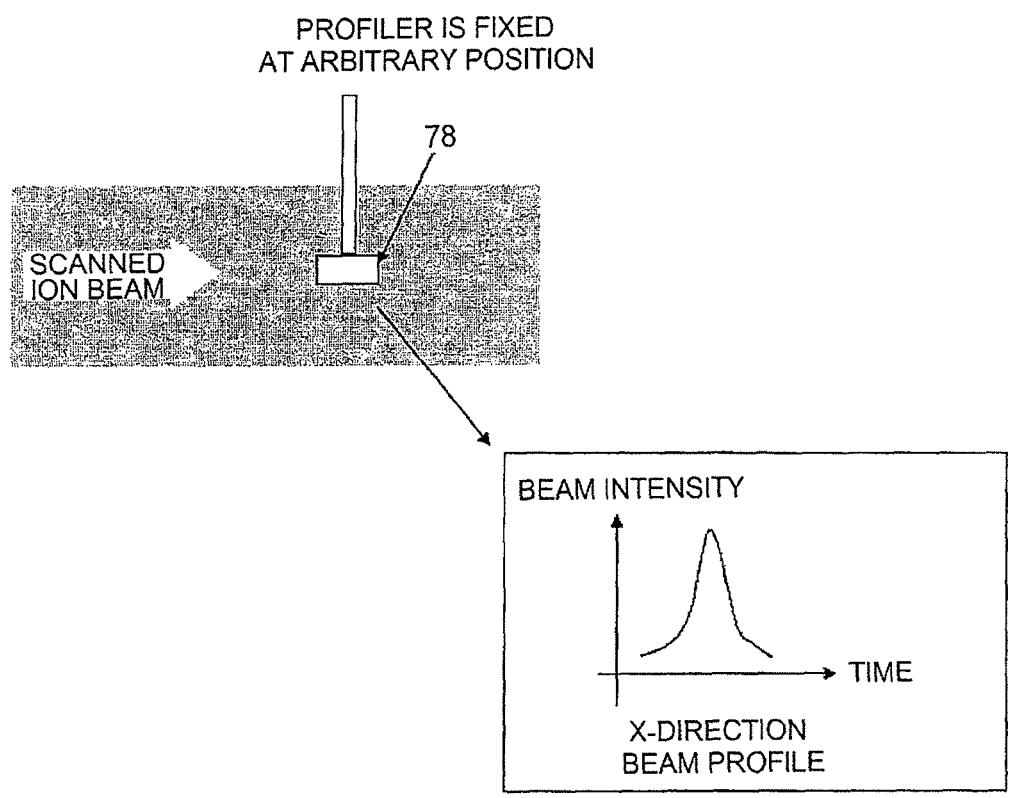
FIG. 3 is a view illustrating an example of a horizontal (X-direction) beam profile that may be obtained in a case where a scanned ion beam collide with a beam profiler in a state in which the beam profiler is disposed in a stationary manner at an arbitrary position of an ion implantation position.

A schematic configuration of an ion implantation apparatus to which the present invention is applied will be described with reference FIGS. 1A and 1B. The ion beam implantation apparatus to which the present invention is applied has a configuration in which an ion beam extracted from an ion source 10 by an extraction electrode 12 is allowed to pass through a beam line that reaches a wafer 58, and a mass-analyzing magnet unit 22, a mass-analyzing slit 28, a beam scanner 36, and a wafer processing chamber (ion implantation chamber) 70 are disposed along the beam line. A wafer mechanical scanning device (mechanical Y-scanning device) provided with a wafer supporting platen that supports the wafer 58 is disposed in the wafer processing chamber 70. The ion beam extracted from the ion source 10 is guided along the beam line to the wafer 58 on the wafer supporting platen that is disposed at an ion implantation position of the wafer processing chamber 70. At a section of the beam line in front of the wafer and a section of the beam line in the vicinity of the wafer (a position immediately in front of or behind the wafer, or a wafer position, that is, an ion implantation position), a side cup current measuring instrument (stationary beam measuring instrument) 76 and an implantation position beam current measuring device (movable or stationary beam measuring device) 78 that measure the ion beam are provided. Particularly, the side cup current measuring instrument 76 is provided at both sides of the ion implantation position (wafer position). As described later, the implantation position beam current measuring device 78 is configured to be fixed, moved, or retreated between a measurement zone of the ion implantation position and a retreated position, and may perform stationary beam measurement at a stationary measurement position within the measurement zone or movable beam measurement while moving within the measurement zone.

A first quadrupole lens device (magnetic field type or electrostatic field type) (first beam focusing device) 24 or a park electrode (a beam retreating (or evacuating) and deflecting device) 26 is disposed between the mass-analyzing magnet unit 22 and the mass-analyzing slit 28 as necessary. A second quadrupole lens device (second beam focusing device) 30 is disposed between the mass-analyzing slit 28 and the beam scanner 36 as necessary. A beam parallelizing device 40, an acceleration and deceleration device 42, and AEF (Angular Energy Filter) 60 are disposed between the beam scanner 36 and the wafer processing chamber 70 as necessary.

FIGS. 1A and 1B show schematic views of the ion implantation apparatus. Among ion beam scanning processing apparatuses, the ion implantation apparatus is a single-wafer-processing-type ion implantation apparatus that performs ion implantation processing of the wafer sheet by sheet. The ion implantation apparatus is provided with an electrostatic field type (or a magnetic field type (not shown)) beam deflection scanning device (hereinafter, referred to as a beam scanner 36), and an electrostatic field type beam parallelizing device 40 (a beam parallelizing lens or parallel lens, and hereinafter, referred to as a parallel lens). Particularly, FIG. 1A is a plan view and FIG. 1B is a side view. With regard to a configuration of the ion implantation apparatus, simple illustration and description will be made from the most upstream side of the beam line starting from the ion source 10.

The extraction electrode 12, which accelerates ions from plasma generated in an ion chamber as an ion beam and extracts the ion beam, is provided at an outlet side of the ion source 10. The ion beam extracted from the ion source 10 are guided along the beam line to the wafer 58 that is disposed at the ion implantation position of the wafer processing chamber 70. The mass-analyzing magnet unit 22, which separates predetermined ions from the extracted ion beam, and extract the ion beam composed of the separated ions, is disposed downstream the ion source 10. The first quadrupole lens device 24 that shapes a cross-sectional shape of the ion beam in an upper and lower (vertical) direction or a transverse (horizontal) direction, and the park electrode 26 that instantaneously deflects the ion beam in a direction deviating from the beam line and temporarily retreats (or evacuates) the ion beam are disposed downstream the mass-analyzing magnet unit 22. Furthermore, the mass-analyzing slit 28 through which the ion beam composed of ions having a predetermined weight pass through, and the second quadrupole lens device 30 that shapes a cross-sectional shape of the ion beam are disposed downstream the mass-analyzing magnet unit 22. The park electrode 26 and the mass-analyzing slit 28 are accommodated in a park housing 27. An injector flag Faraday cup 32, which is put into or taken from the beam line to totally block the ion beam and measure the entirety of a beam current as necessary, is disposed downstream the second quadrupole lens device 30. The electrostatic type (or magnetic type) beam scanner 36, which periodically deflects the ion beam having an elliptical or circular cross-sectional shape in a reciprocating manner in a transverse direction (horizontal direction or X-direction) orthogonal to a travel direction of the ion beam, is disposed downstream of the injector flag Faraday cup 32. In addition, the injector flag Faraday cup 32 also functions as an insertion type beam stopper.

The electrostatic type parallel lens 40 is disposed downstream the beam scanner 36. The parallel lens 40 deflects again the ion beam, which are continuously deflected by the beam scanner 36 to have a deflection angle in a horizontal direction orthogonal to the beam line direction that is the ion beam travel direction before the deflection, in order for the deflected ion beam to be parallel with the beam line direction. That is, the ion beam deflected in the horizontal direction with the beam scanner 36 become the ion beam parallel with the ion beam travel direction (beam line direction) before the deflection due to an electric field between a plurality of electrodes constituting the parallel lens 40. The parallel lens 40 may be a magnetic type.

The ion beam, which are deflected again by the parallel lens 40, are transmitted to the AEF 60 after being adjusted to have necessary beam energy (beam electrostatic acceleration energy) by the acceleration and deceleration device 42 as necessary. The acceleration and deceleration device 42 is constituted by a plurality of linear electrodes, and accelerates or decelerates the ion beam by adjusting a voltage of the electrodes. The AEF 60 of a hybrid type is disposed downstream the acceleration and deceleration device 42. In the AEF 60, analysis with regard to energy of the ion beam is performed, and only ion species having necessary energy are selected. That is, the AEF 60 is an energy filter that selects the ion beam with which target acceleration energy may be obtained.

The AEF 60 is provided with magnetic deflection electromagnet for magnetic field deflection, and an electrostatic deflection electrode for electrostatic field deflection. Although not shown, the magnetic deflection electromagnet is disposed to surround the left, right, top, and bottom of an AEF chamber (not shown), and is constituted by yoke members that surround the left, right, top, and bottom of the AEF chamber, respectively, and left, right, top, and bottom coil groups that are wound around the yoke members, respectively. On the other hand, the electrostatic deflection electrode is constituted by a pair of AEF electrodes 62, and the pair of AEF electrodes 62 is disposed in order for the ion beam to be interposed therebetween in the vertical direction. During deflection by a magnetic field, only the ion beam having target energy may be selected by deflecting the ion beam to a lower side by approximately 10 to 30° using a magnetic filed from the magnetic deflection electromagnet. On the other hand, during deflection by an electrostatic field, similar to the deflection by magnetic field, the ion beam having the target energy may be selected by deflecting the ion beam to a lower side using an operation of an electrostatic field generated between the pair of AEF electrodes 62.

The wafer processing chamber (ion implantation chamber or ion implantation process chamber) 70 is disposed at a distal end of the beam line. The wafer processing chamber 70 communicates with the above-described AEF chamber. An energy resolution variable slit (SES: Selectable Energy Slit) and a plasma shower (all of these are not shown) are disposed in the wafer processing chamber 70. The energy resolution variable slit have a plurality of slit surfaces, and the slit surfaces are sequentially changed depending on ion species to reduce cross contamination. The plasma shower supplies low-energy electrons to a front surface of the wafer 58 together with the ion beam, and neutralizes and suppresses charge-up of positive charges that occur due to ion implantation to the wafer 58. A side cup (dose cup) current measuring instrument 76 is disposed at sites, which correspond to both sides of the wafer 58 in the horizontal direction, in front of the wafer in the wafer processing chamber 70 and in the vicinity of left and right ends of the plasma shower. The side cup current measuring instrument 76 measures a beam current (a dose amount) also during ion implantation. Specifically, the side cup current measurement instrument 76 includes a side cup that is connected to a current measuring circuit, the ion beam that enters the side cup is neutralized by electrons flow into the current measuring circuit. Accordingly, the side cup current measurement instrument 76 performs measurement of the ion beam by measuring the flow of the electrons.

The implantation position beam current measuring device 78 is provided in a section in the vicinity of the wafer, which is the ion implantation position. The implantation position beam current measuring device 78 includes a Faraday cup serving as a beam profiler that performs measurement of intensity of a beam current and measurement of a beam shape in a scanning direction at the ion implantation position. Commonly, the Faraday cup has an elliptical or rectangular beam incidence opening. As the implantation position beam current measuring device 78, a movable measurement type or a stationary measurement type provided with a single row of beam profiler cup (FIGS. 2A and 2B), or a stationary implantation position beam current measuring device 78a (including a moving and fixing device) provided with plural rows of beam profiler cup groups (FIG. 2C) may be used.

Commonly, the implantation position beam current measuring device 78 of the movable measurement type or the stationary measurement type is retreated from the beam scanning position. As shown in FIG. 4B, the implantation position beam current measuring device 78 of the movable measurement type includes a slit measurement unit 78-1 and a multi-hole measurement unit 78-2. The implantation position beam current measuring device 78 of the movable measurement type measures ion beam density (beam current density) at respective positions (several tens of point positions to several thousands of point positions or more) of the ion implantation position in the horizontal direction with the slit measurement unit 78-1 while moving from a retreated position in the horizontal direction to be orthogonal to the ion beam (scanned ion beam) that scans a beam scanning region before the ion implantation or the like. In addition, the implantation position beam current measuring device 78 of the movable measurement type is moved from the retreated position to an intermediate portion on the beam scanning region before the ion implantation or the like and is stopped at the position, and then measures a profile of the scanned ion beam in the beam scanning direction (horizontal direction) and an integrated current value thereof with the slit measurement unit 78-1 and measures a vertical beam profile of the scanned ion beam in an upper and lower direction (vertical direction) with the multi-hole measurement unit 78-2.

Commonly, the implantation position beam current measuring device 78a of the stationary type (FIG. 2C) is also retreated from the beam scanning position. As shown in FIG. 4C, the implantation position beam current measuring device 78a includes plural rows of slit measurement units (plural rows of beam profiler cup groups) 78a-1 that are arranged in a line in the horizontal direction, and a multi-hole measurement unit 78a-2 that is provided between central two slit measurement units 78a-1. A position of the implantation position beam current measuring device 78a is changed from the retreated position to the beam scanning position before ion implantation or the like. The implantation position beam current measuring device 78a measures the ion beam density (beam current density) and a horizontal ion beam profile of the beam (scanned ion beam), which scans the beam scanning region, at respective cup positions (several tens of point positions to several thousands of point positions or more) of the plural rows of beam profiler cup groups of the ion implantation position in the horizontal direction with the slit measurement unit 78a-1. In addition, the implantation position beam current measuring device 78a measures the vertical beam profile of the scanned ion beam in the upper and lower direction (vertical direction) with the multi-hole measurement unit 78a-2.

Accordingly, with regard to any case of the movable measurement type and the stationary measurement type, in a case where from results of the beam current measurement, the uniformity of the ion beam density in the beam scanning direction does not satisfy process request, a control device to be described later automatically performs adjustment (beam tuning) of an application voltage of the beam scanner 36 so as to satisfy process conditions, and performs again the measurement of the implantation position beam current with the implantation position beam current measuring device 78 (78a) as necessary.

Returning to FIGS. 1A and 1B, a tuning Faraday cup 80 such as the Faraday cup, which has a function of measuring the entirety of beam currents and measures a final set-up beam at a position behind the ion implantation position, may be disposed at the most downstream side of a beam line.

The tuning Faraday cup 80 represents one of a plurality of stationary beam measuring instruments different from the side cup current measuring instruments 76. For example, as shown in FIG. 4D, one stationary beam measuring instrument among the plurality of stationary beam measuring instruments is constituted by the tuning Faraday cup 80 having an opening 80a to which the ion beam is incident. In addition, in a case of performing measurement simultaneously with the measurement of the vertical profile and the horizontal profile by the implantation position beam current measuring device 78 provided at the ion implantation position, with regard to a range that may not be measured by the implantation position beam current measuring device 78, a measurement value may be obtained by performing a complementary operation of an integrated current value, which is obtained by measurement with the tuning Faraday cup 80, from a value at a position in front of or behind the range that may not be measured.

FIGS. 2A to 2C show views illustrating a situation in which ion implantation to the wafer 58 is performed by using the beam scanning by the beam scanner 36 and the mechanical Y-scanning by the wafer mechanical scanning device are used in combination.

In FIGS. 2A to 2C, the wafer mechanical scanning device is provided with an elevation device 11. The elevation device 11 includes a wafer supporting platen 59 that holds the wafer 58, and vertically moves the wafer 58 by vertically moving (mechanical Y-scanning) the wafer supporting platen 59. FIG. 2A illustrates that the wafer 58 is moved in a reciprocating manner in a vertical direction in the drawing together with the elevation device 11, and FIG. 2B illustrates that the wafer 58 is moved in a reciprocating manner (mechanical Y-scanning) together with the wafer supporting platen 59 of the elevation device 11 in a direction orthogonal to a plane of the drawing. That is, in a case where the reciprocating scanning by the ion beam is set to be performed, for example, in one axial direction, the wafer 58 is driven to move in a reciprocating manner by the elevation device 11 in another direction orthogonal to the one axial direction.

In addition, the wafer mechanical scanning device includes a CPU (Central Processing Unit) 100 and a RAM (Random Access Memory) 110 that memories a vertical position of the wafer 58 in addition to the elevation device 11. The CPU 100 receives a position detection signal supplied from a position sensor (not shown) that detects the vertical position of the wafer 58, and stores the position of the wafer 58 in the RAM 110 as necessary. A pair of the side cup current measuring instruments 76 is disposed stationary positions in a region irradiated with the ion beam, here, left and right positions of the elevation device 11, and measures an amount of beam current (dose amount), and outputs a measurement value to the CPU 100.

To perform a control conforming to a variation of the beam and a variation of the dose amount, the CPU 100 shown in FIG. 2A controls a mechanical Y-scanning speed of the elevation device 11 in order for the vertical ion implantation distribution of the wafer to be constant on the basis of a measurement value that is measured by both or one of the pair of side cup current measuring instruments 76.

As shown by a broken-line arrow (an arrow in a direction to which X is given) in FIGS. 2A to 2C, in a case of a maximum beam scanning width, reciprocating scanning (beam scanning or X-scanning) with the ion beam is performed by the beam scanner 36 in a horizontal direction (transverse direction or X-direction) so as to periodically across the pair of side cup current measuring instruments 76. When the wafer 58 is moved in an upper and lower direction (vertical direction or Y-direction) as indicated by a solid-line arrow (arrow in a direction to which Y is given) with respect to the ion beam that carries out the reciprocating scanning in the horizontal direction, the ion beam scans the entire surface of the wafer 58 in a reciprocating manner. As a result, ions of the ion beam are implanted to the entire surface of the wafer 58. Specifically, ions are implanted to the entire surface of the wafer 58 while the wafer 58 is moved from the lowermost position to the uppermost position, or from the uppermost position to the lowermost position.

However, the implantation position beam current measuring device 78 of the movable measurement type may be fixed at an arbitrary position of the ion implantation position as a beam profiler, and the beam waveprofile of the scanned ion beam may be measured at a high speed by the AD conversion-type variable measuring instrument (AD converter, for example, a digital oscilloscope) that is connected to the implantation position beam current measuring device 78. In a case where both of this measured beam waveprofile and the beam current that is measured by the side cup current measuring instruments 76 are set as a reference, and then the beam tuning is carried out by the CPU 100, the beam residual phenomenon does not occur. In a case of this embodiment, the CPU 100 may simultaneously tune not only the amount of the beam current but also the spreading (beam size) of the beam, and thus both of these may be tuned with high reproducibility.

With regard to the scanned ion beam, to realize measurement of an X-direction profile substantially equal to stationary beam, the present invention is configured in such a manner that the scanned ion beam is measured by a beam profiler (implantation position beam current measuring device 78) stopped at an arbitrary position of the ion implantation position as shown in FIG. 3 by utilizing characteristics of electrostatic scanning in the beam scanner 36, and thus the X-direction scanned ion beam profile that is substantially equivalent to the stationary beam profile in the X-direction (transverse direction) and the integrated current value may be measured. In this configuration, when the beam intensity measured by the beam profiler is measured by a measurement instrument such as an AD conversion type variable measuring instrument (for example, a digital oscilloscope) capable of performing high-speed AD conversion, and then the beam intensity at an arbitrary time capable of increasing a time resolution of the beam intensity is plotted, a profile that is substantially equivalent to the X-direction beam profile may be obtained.

An advantage of this measurement is that one data may be acquired with one scanning of the electrostatic scanning (a frequency is several hundreds of Hz to several kHz) by the beam scanner 36, and data acquisition of one sample at several hundreds of msec is possible even considering data transmission. A time taken to acquire the X-direction profile that is necessary for the beam tuning may be greatly shortened compared to the related art.

Figure 4A:
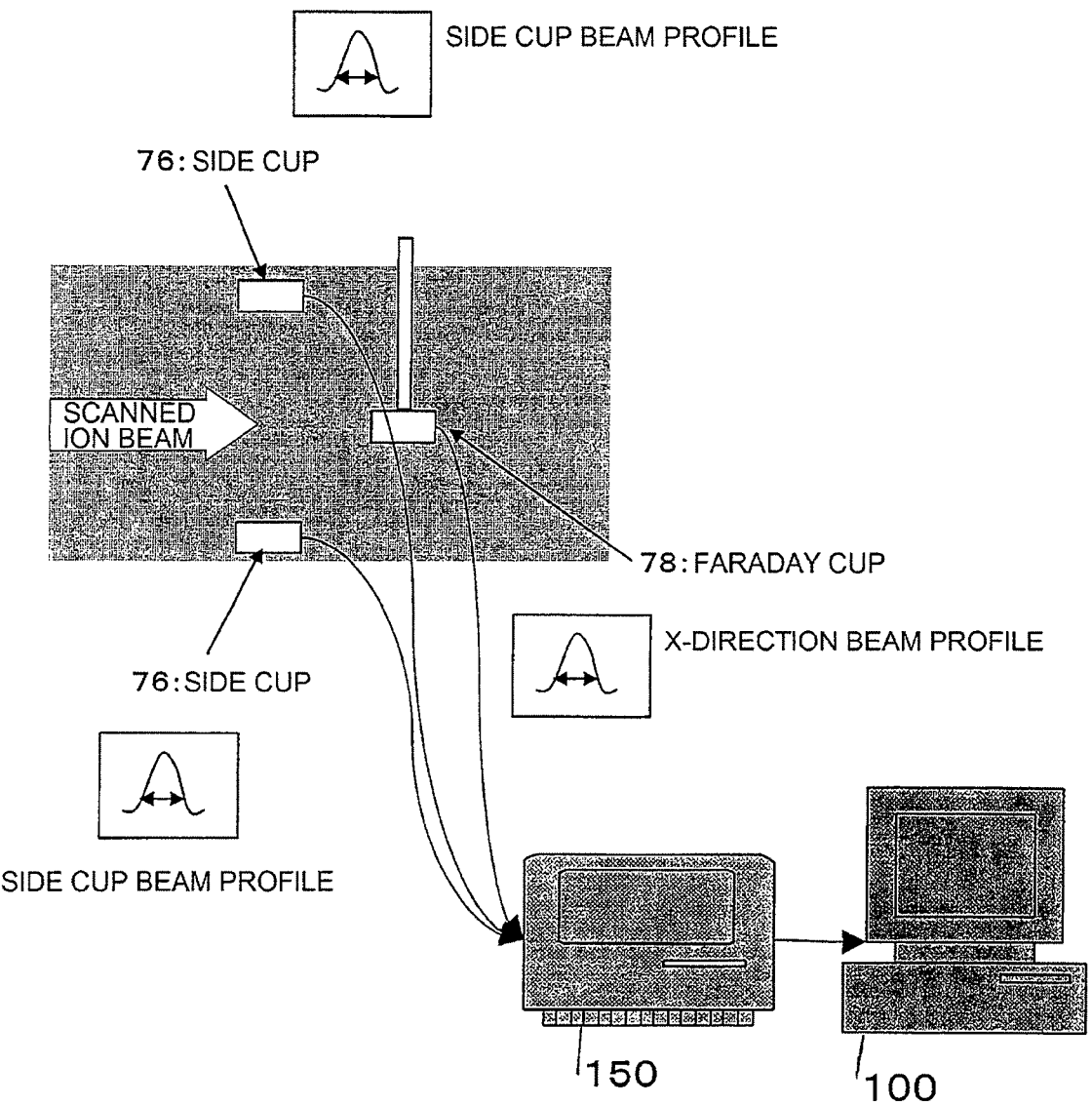
FIG. 4A is a view illustrating a connection configuration example between a control device, and an implantation position beam current measuring device (beam profiler) and a side cup current measuring instrument among control systems configured to realize an ion beam scanning processing by the present invention.
Figure 4B:
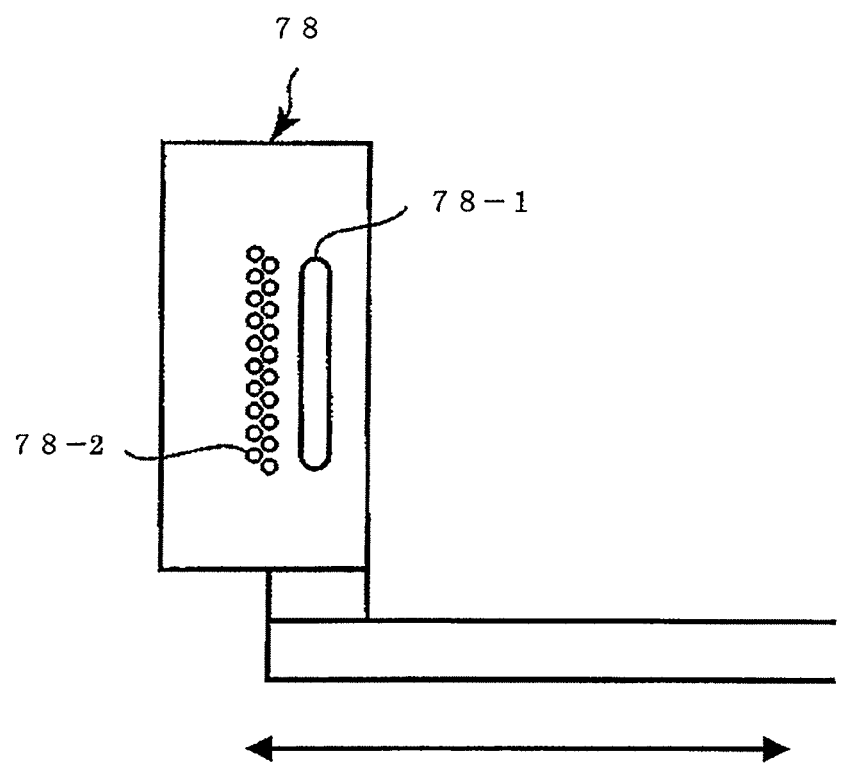
FIG. 4B is a view illustrating an example of a movable or stationary implantation position beam current measuring device (beam profiler)
Figure 4C:
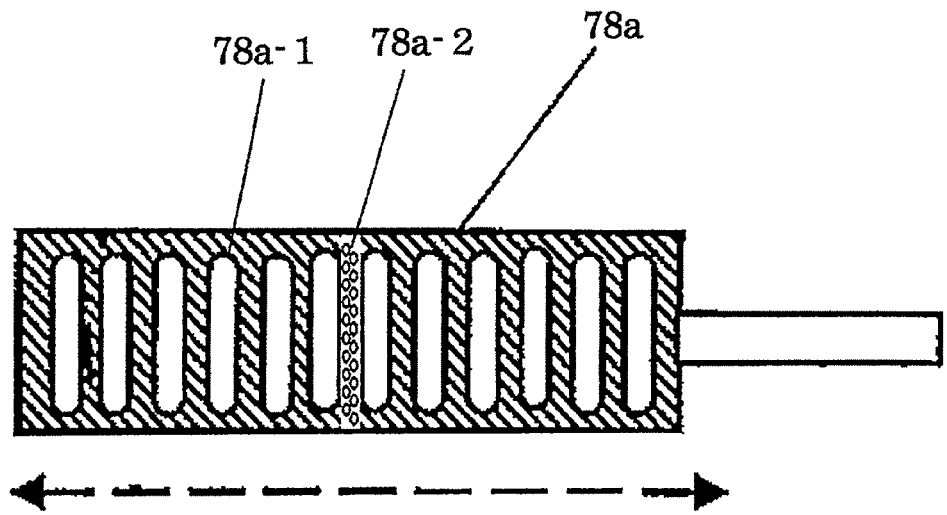
FIG. 4C is a view illustrating an example of a stationary implantation position beam current measuring device.
Figure 4D:
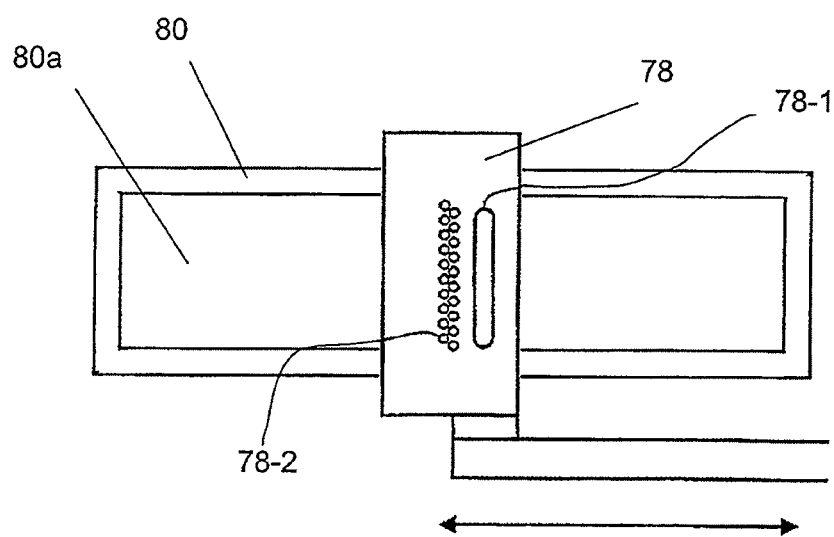
FIG. 4D is a view illustrating one measurement type by a movable or stationary implantation position beam current measuring device and a tuning Faraday cup behind the ion implantation position.

In the present invention, as shown in FIG. 4A, the control device (CPU) 100 is connected to the pair of side cup current measuring instruments 76 and the movable measurement type beam profiler (implantation position beam current measuring device 78) through an AD conversion variable measuring instrument 150. According to this, in addition to the beam profiler (implantation position beam current measuring device 78) that is stopped at an arbitrary position, a current waveform, which is obtained by the side cup current measuring instruments 76 and 76 that are disposed at both sides of the ion implantation position, is fetched to the control device (CPU) 100.

FIG. 4B shows an example of the implantation position beam current measuring device 78. The implantation position beam current measuring device 78 includes a slit measurement unit 78-1 that extends in a vertical direction, and two rows of multi-hole measurement units 78-2 that are vertically arranged. The slit measurement unit 78-1 is used for measurement of the beam current, the horizontal beam profile, and the integrated current value. On the other hand, the multi-hole measurement units 78-2 are used to detect a beam profile in an upper and lower direction (vertical beam profile). Apparently continuous detection data may be obtained with a disposition type in which each multi-hole of the second row is positioned at a site adjacent to a portion between multi-holes of first row. The implantation position beam current measuring device 78 is configured as a movable measurement type that may be advanced or retreated in a direction indicated by an arrow in the drawing by a driving mechanism (not shown), and may be fixed at an arbitrary position.

An object of adapting the above-described configuration is to make ion beam density at the center of the scanning range with the ion beam and ion beam density at both ends of the scanning range uniform as much as possible. This is because when in a subsequent uniformalizing of the scanned ion beam, the X-direction distribution of the beam intensity is uniform from the beginning, tuning of the uniformalizing is terminated in a short time. Furthermore, this is because that even when the X-direction profile (horizontal beam profile) and the integrated current value at a position of the beam profiler that is stopped are tuned to be within the upper and lower set limits that are previously set, since it is difficult to say that the profile and the integrated current value at both ends (both ends of scanning range) in the X-direction are within the upper and lower set limits that are previously set, it is necessary to perform the tuning by fetching profile data and current data as total three points including the center of the scanning range and the both side ends of the scanning range.

Next, an operation principle of a case of applying the present invention to the above-described ion implantation apparatus will be described.

Figure 9:
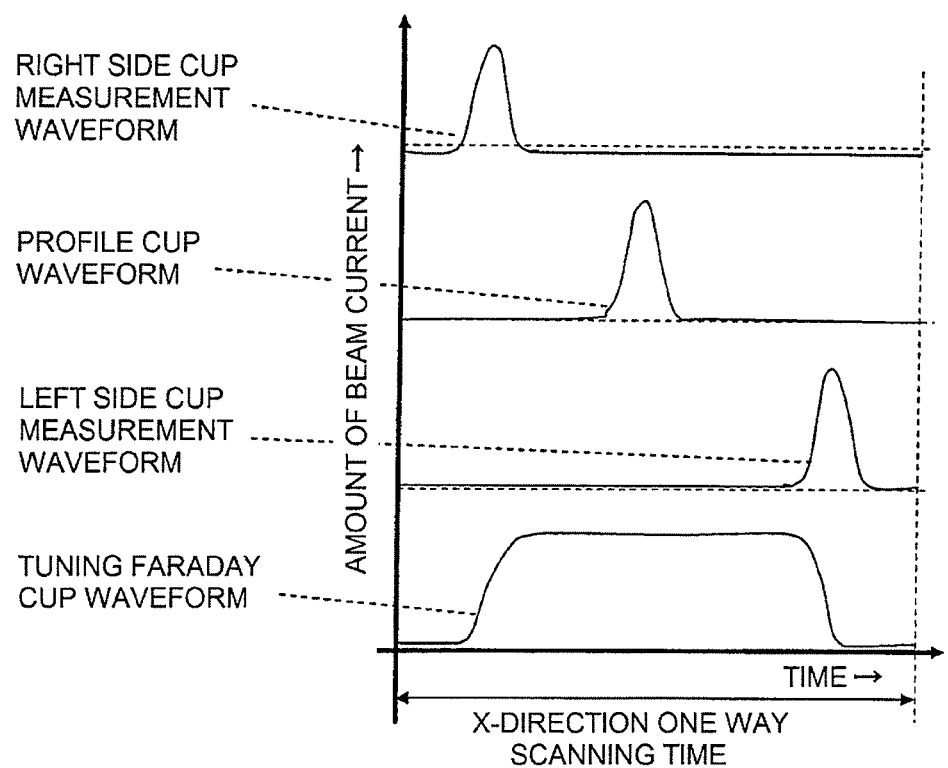
FIG. 9 is a view illustrating an example of waveprofiles from Faraday cups that are provided in a side cup current measuring instrument, an implantation position beam current measuring device, and a tuning Faraday shown in FIG. 1, respectively.
Figure 10:
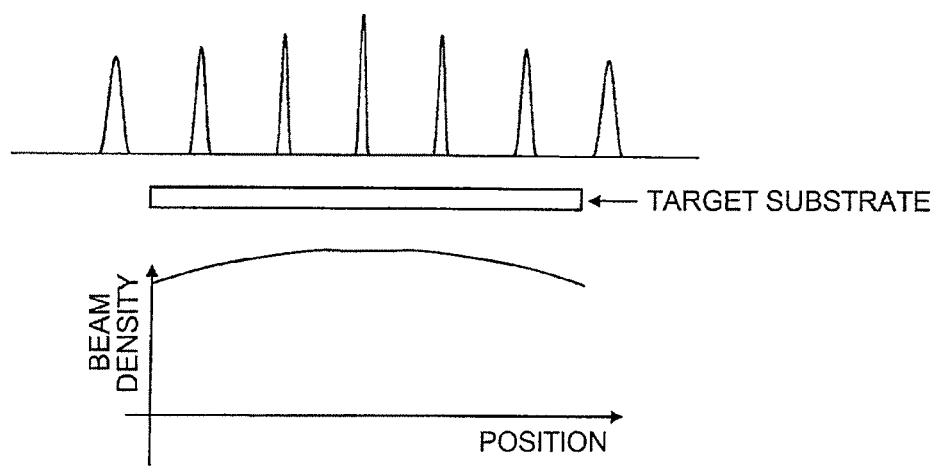
FIG. 10 is a view illustrating an example of a horizontal ion beam density distribution in a case where a horizontal beam size of an ion beam is small.
Figure 11:
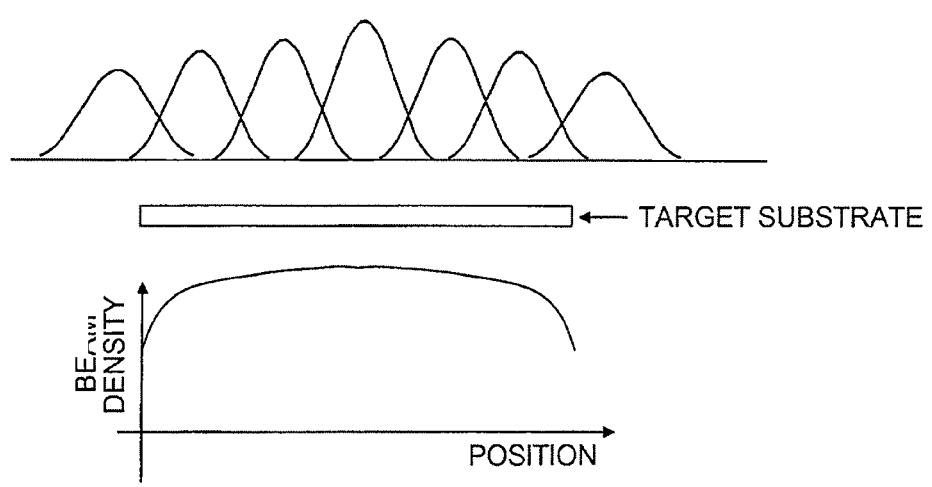
FIG. 11 is a view illustrating an example in which a beam residual phenomenon occurs as the horizontal beam size of the ion beam increases, and thus horizontal ion beam density decreases at ends of a scanning range.
Figure 12A:
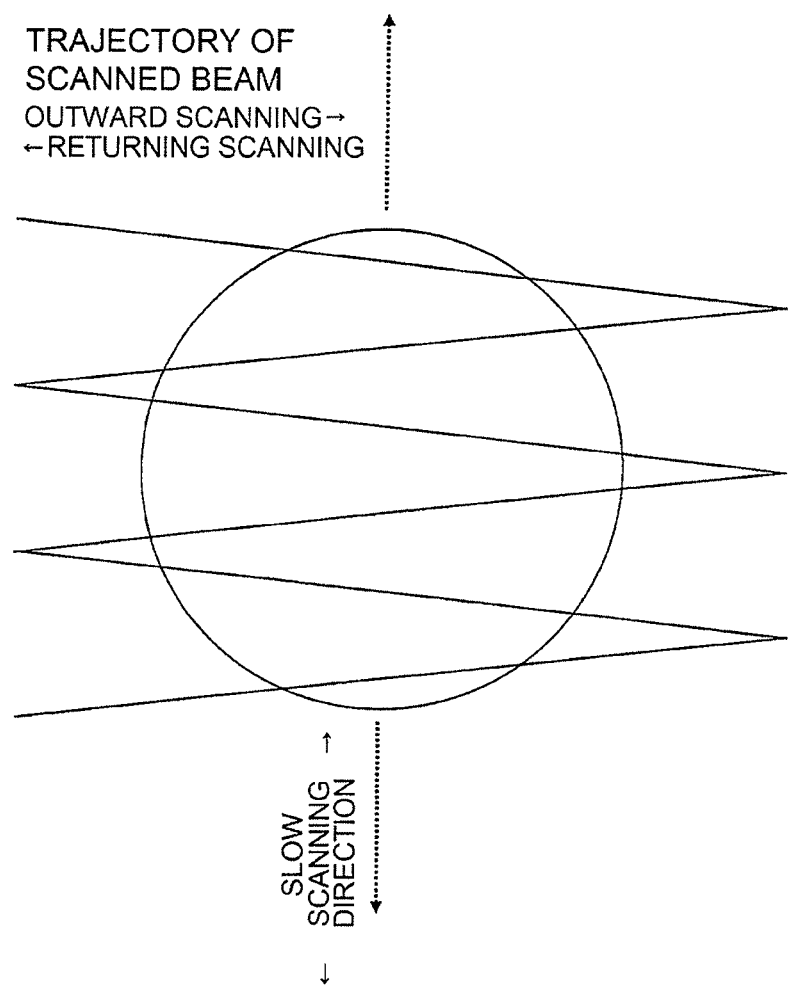
FIG. 12A is a view illustrating an example in which uniformity of ion implantation density in the Y-direction deteriorates in a case where a first scanning (X-scanning) frequency is low to the same degree as a slow scanning (mechanical Y-scanning) frequency, and a vertical beam size in the Y-direction is smaller than that of the slow scanning.
Figure 12B:
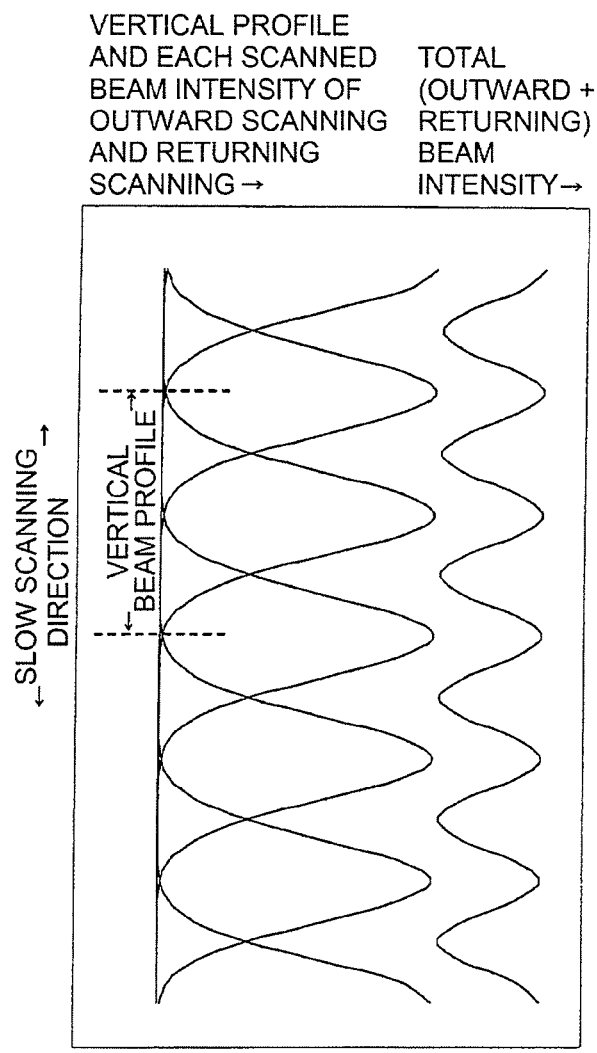
FIG. 12B is a view illustrating an example in which beam density uniformity in the Y-direction deteriorates in a case where the first scanning frequency is low to the same degree as the slow scanning frequency, and the vertical beam size in the Y-direction is smaller than that of the slow scanning similar to FIG. 12A.
Figure 13:
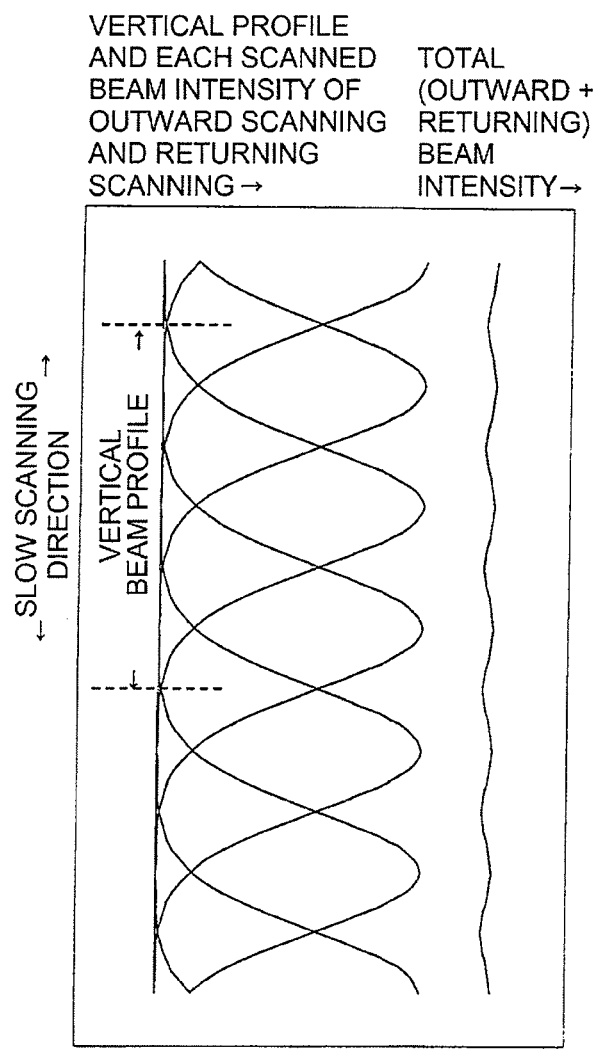
FIG. 13 is a view illustrating an example in which the vertical beam size in the Y-direction increases in FIG. 12B, and thus the uniformity of the ion implantation density in the Y-direction is improved.

Referring to FIG. 9, the control device (CPU) 100 uses a beam waveprofile output signal (a second signal from the upper side: a waveprofile of a profile cup) supplied from the slit measuring unit 78-1 of the beam profiler (implantation position beam current measuring device 78), and two beam waveprofile signals (first and third signals from the upper side: right or left side cup measurement waveprofiles) supplied from the side cup current measuring instruments 76 for tuning of the ion beam. In addition, a control device 100 uses beam intensity that may be obtained from a waveprofile (a first waveprofile from a lower side: a tuning Faraday cup waveprofile) supplied from a Faraday cup equipped in a beam dump (tuning Faraday cup 80) that is used for parameter tuning in the related art. The beam waveprofile output signals are measured by an AD conversion variable measuring instrument or the like, are numerically converted into a beam width or the like, and then are used as a reference for parameter tuning.

Since a plurality of signals (multi-variables) are monitored as a reference, the control device 100 converts these signals into one variable using a function of a composed desirability value, and tunes apparatus parameters in order for this value to be maximum (for example, a set value whose maximum value is "1"), thereby obtaining a desired beam state. A calculation expression is devised in such a manner that when a composed desirability value becomes the set value (for example, "1"), the entirety of variables satisfy a specified limit. Furthermore, a plurality of the composed desirability values are prepared in accordance with parameter characteristics.

The beam waveprofiles supplied from the beam profiler (implantation position beam current measuring device 78), the side cup current measuring instruments 76, and the like are fetched to AD conversion type variable measuring instrument 150. Data at this point of time is constituted by a data row (t0, l0), (t1, l1), ..., (tn, ln) with a type of beam intensity. It is necessary to numerically convert the data in order for the data to be used for tuning control.

In the present invention, the numerical conversion of the waveprofile data is configured to be carried out, for example, by the following (1) to (4).

Figure 5A:
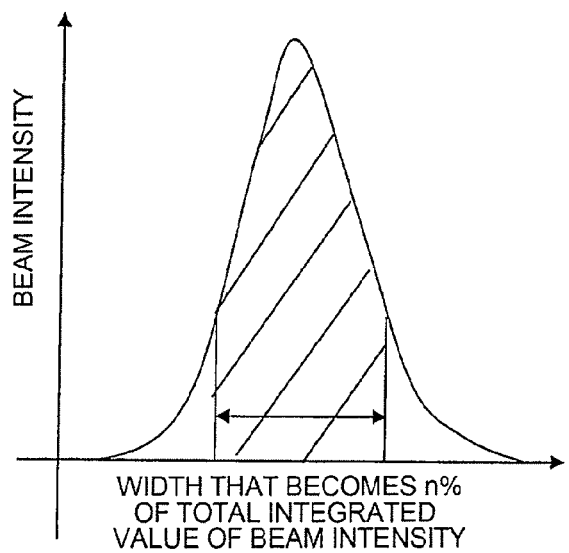
FIGS. 5A to 5D are views illustrating four examples in a case where waveprofile signals supplied from the implantation position beam current measuring device (beam profiler) and the side cup current measuring instrument are numerically converted to be used for a tuning control of an ion beam.
Figure 5B:
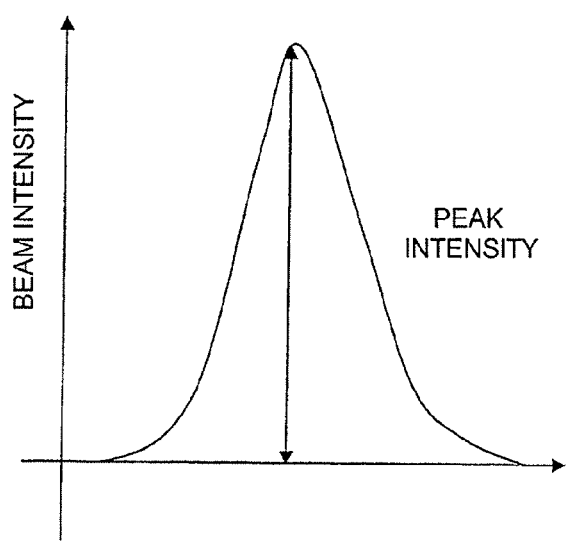
Figure 5C:
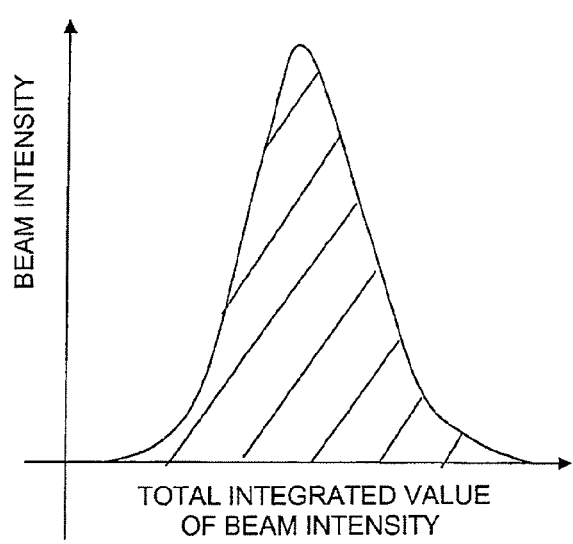
Figure 5D:
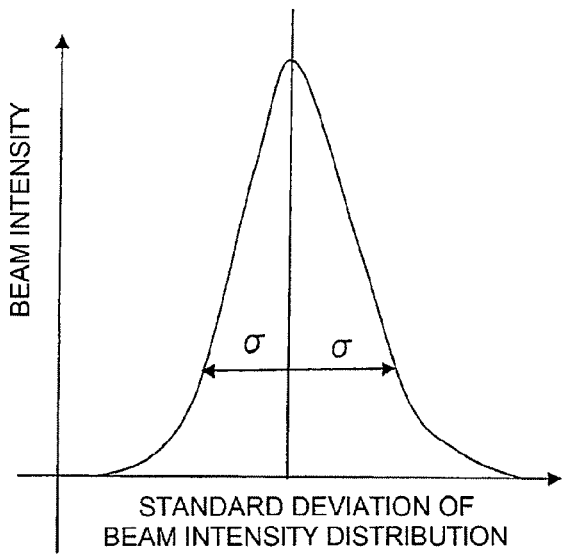

Referring to FIGS. 5A to 5D, (1) A beam width that is n % (n represents a desired value, for example, 70) of a total integrated value of beam intensity (FIG. 5A), (2) Beam peak intensity (FIG. 5B), (3) A total integrated value of beam intensity (FIG. 5C), and (4) A standard deviation of a beam intensity distribution (FIG. 5D).

With regard to the parameter tuning, in a case where a response to be optimized is composed of a mono-variable, the parameter may be made to vary in order for the mono-variable to be a desired value. However, in a case where the response is composed of multi-variables like the present invention, it is necessary to compose these variables and convert into one variable. Therefore, in the present invention, an individual desirability value and a composed desirability value are introduced to be used for control.

Figure 6:
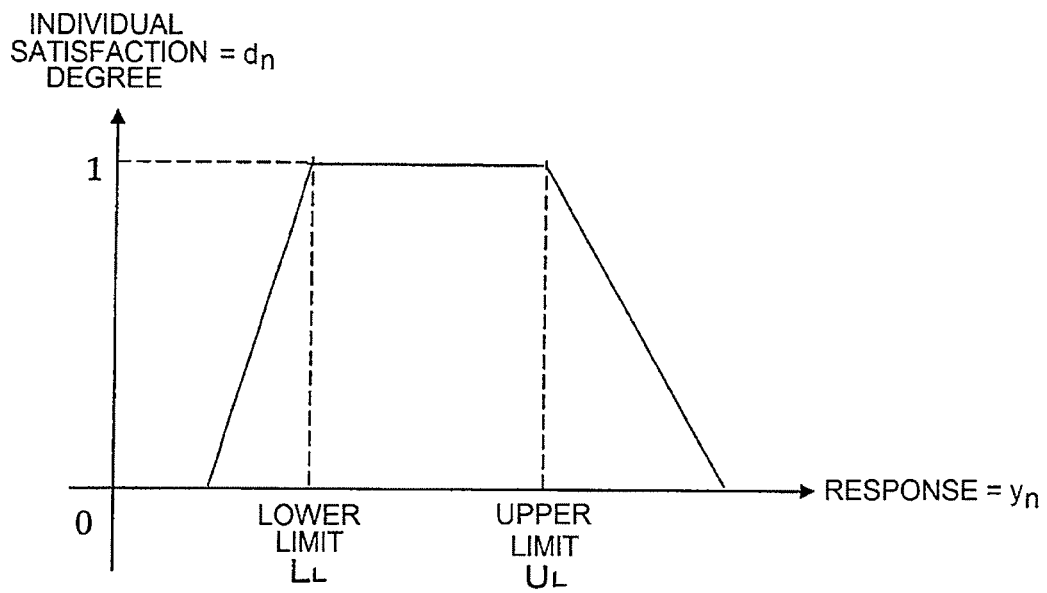
FIG. 6 is a view illustrating a relationship between a response (horizontal axis) and the upper and lower set limits thereof, and an individual desirability value (vertical axis) in parameter tuning.

As shown in FIG. 6, when taking one response $y_n$, for example, a beam width to be optimized at the horizontal axis, a standard value of the upper limit $U_L$ and a standard value of the lower limit $L_L$, which satisfy the response, are set, and the individual desirability value $d_n$ is set to a trapezoidal function form in order for the individual desirability value to be 1 when the response enters between the upper and lower limits (the upper limit standard value and the lower limit standard value).

As the composed desirability value D, the following expression is used.

$$D = \alpha_1 \cdot d_1^{\beta_1} + \alpha_2 \cdot d_2^{\beta_2} + \ldots + \alpha_n \cdot d_n^{\beta_n}$$

$\alpha_n$ represents a weight of the individual desirability value. When this weight is made large, $\alpha_n$ has a function of carrying out an operation in which a corresponding response is preferentially optimized during parameter tuning. In addition, the weight $\alpha$ is set to satisfy the following expression (2).

$$\sum_{i=1}^{n} \alpha_i = 1 \tag{2}$$

In this state, when the composed desirability value D becomes the set value (for example, 1), all of responses enters the upper limit standard value and the lower limit standard value, and thus tuning is completed.

Figure 7:
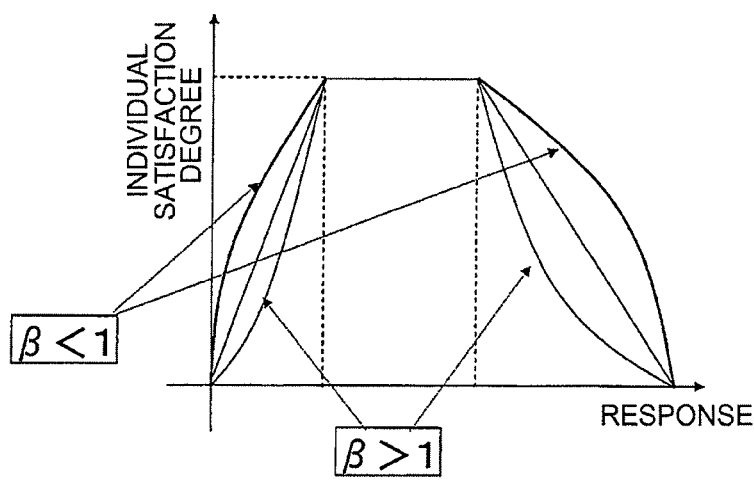
FIG. 7 is a view illustrating a coefficient βn indicating strictness with respect to an upper limit standard value and a lower limit standard value used in an expression that expresses the individual desirability value.

$\beta_n$ represents a coefficient indicating strictness with respect to the upper limit standard value and the lower limit standard value. As shown in FIG. 7, when $\beta_n > 1$ is set, the individual desirability value is not raised unless the response is close to the upper limit standard value and the lower limit standard value. On the other hand, $\beta_n < 1$ is set, even when the response is distant from the upper limit standard value and lower limit standard value, the individual desirability value is raised.

The beam waveprofile data that is fetched to the control device 100 from the AD conversion-type variable measuring instrument (AD converter) 150 is processed by a continuously operating tracking task. When values of respective elements, which are various device parameters, are tuned in order for one variable value to be maximum, a desirably optimized beam state may be obtained. In the ion source, the values of the elements of various device parameters are values of a gas flow rate that is an adjustment factor of plasma and a thermal electron, an arc current, a filament current, an arc voltage, a cathode voltage, and a cathode current. In each element of the beam line downstream the ion source, the values of the elements of various device parameters are values of a position of an extraction electrode 12, and respective currents or voltages of the mass-analyzing magnet unit 22, an X-steerer, the first and second beam focusing lens (first and second quadrupole lens devices 24 and 30), the electrostatic scanner (beam scanner 36), the electrostatic parallelizing lens (parallel lens 40), the acceleration and deceleration device, the electrostatic/magnetic field AEF (AEF 60), and other electrodes.

An example of the tracking task will be described with reference to FIG. 8.

(1) The control device 100 fetches the beam waveprofile at all times, processes the fetched waveprofile data into a numerical value, and calculates a composed desirability value by a desirability value function defined in advance.

(2) The composed desirability value that is calculated is set in a memory capable of being referenced commonly by the control device 100, for example, a reference table of the RAM 110.

(3) The control device 100 calculates plural kinds of composed desirability values in accordance with characteristics of parameters to be tuned. This may be changed into a method of applying the weight $\alpha_n$ with respect to the respective individual desirability values, and strictness $\beta_n$ with respect to the upper limit standard value and the lower limit standard value.

Figure 8:
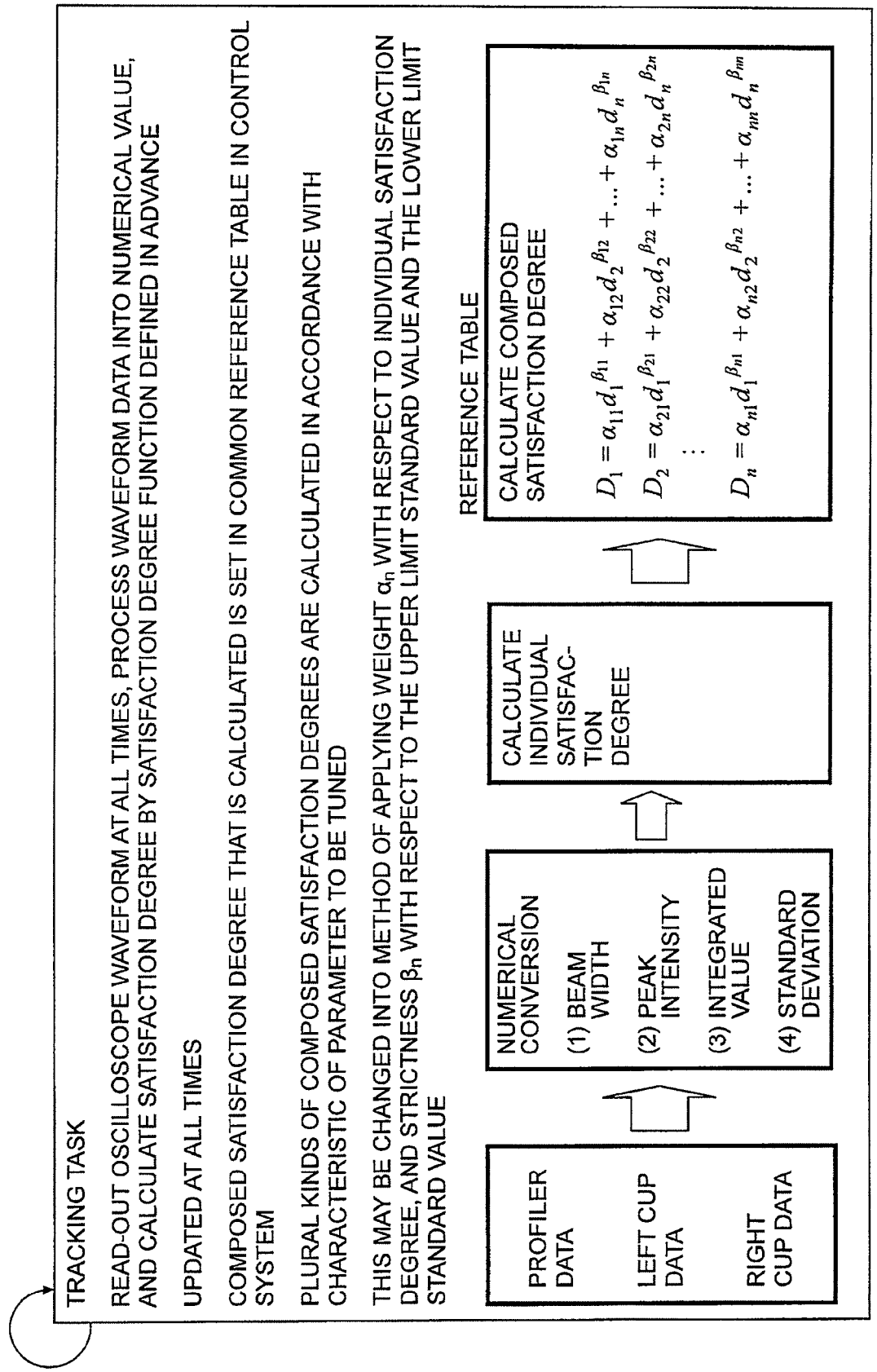
FIG. 8 is a view illustrating a tracking task that is one processing in a control device.

FIG. 8 illustrates a situation in which the beam waveprofile supplied from the beam profiler (implantation position beam current measuring device 78) is fetched to the control device 100 as a profiler data, and the two beam waveprofiles supplied from the side cup current measuring instruments 76 are fetched to the control device 100 as left cup data and right cup data. As described with reference to FIGS. 5A to 5D, the waveprofile data is numerically converted into a beam width that is n % of a total integrated value of beam intensity, peak intensity, the total integrated value of beam intensity, and a standard deviation of a beam intensity distribution. Subsequently, the composed desirability value is calculated by a calculation expression that is determined in advance in the tracking task, and the composed desirability value is set in a memory capable of being referenced commonly by the control device 100, for example, a reference table in the RAM 110. A plurality of the composed desirability values are prepared in accordance with characteristics of the parameter to be tuned.

Next, a scanning voltage correction function will be described. As described above, with regard to the ion implantation apparatus, it is important to maintain in-plane uniformity of an amount of ion implantation (dose amount) in the wafer. In the ion implantation apparatus that adapts the beam scanning (X-scanning) as the first scanning, and the upper and lower direction (vertical or Y-direction) mechanical Y-scanning (Y-scanning) as the slow scanning, to maintain the uniformity of the horizontal (X-direction) ion beam density distribution, a correction based on beam measurement of the implantation position beam current measuring device 78 is added to each beam scanning voltage value by a scanning voltage control function of the beam scanner, that is, a reference beam scanning control function.

A function that is necessary to carry out the correction is called a scanning voltage correction function. Due to this scanning voltage correction function, a corrected scanning voltage value, which may be actually applied to the beam scanner 36, becomes a beam scanning voltage correction control function. The beam scanning voltage correction control function may maintain the uniformity of the horizontal (X-direction) ion beam density distribution and may set the beam scanning width.

With regard to the uniformity of the vertical (Y-direction) ion implantation distribution, the mechanical Y-scanning speed is made to vary in a follow-up manner on the basis of a beam current measurement value of both of or one of the side cup current measuring instruments 76 in accordance with an amount of a beam current, which is previously set, so as to correspond to correction of a dose amount due to minute fluctuation and minute variation of the beam.

In addition, at a beam current adjustment stage before the ion implantation, the control device may be configured to simultaneously perform the adjustment of a beam current to a preset value of the beam current (a preset value that is set in advance), and the adjustment of a vertical beam size. In this case, the adjustment of a beam current to the preset value of the beam current is carried out on the basis of measurement values of the stationary measurement type beam measuring instrument and the movable measurement type beam measuring device, the adjustment of the vertical beam size is carried out on the basis of a vertical beam scanning overlapping relationship (relationship capable of maintaining a set overlapping width) between the mechanical Y-scanning speed and the vertical beam size in accordance with the mechanical Y-scanning speed.

As can be understood from the description above, according to the above-described embodiment, the following effects may be obtained.

(1) In the beam profile measurement in the related art, beam scanning is stopped, and then a beam profiler is made to move with respect to a stationary ion beam. Conversely, in this embodiment, characteristics of the ion beam scanned by the beam scanner are utilized. The beam profiler (implantation position beam current) measuring device 78 is fixed at an arbitrary position of the ion implantation position, and then beam scanning is performed. According to this, beam profiles {scanning direction (horizontal or X-direction) and upper and lower direction (vertical or Y-direction) profiles} may be measured at a high speed. Particularly, when combining a measurement instrument such as an AD conversion-type variable measuring instrument (for example, a digital oscilloscope) that is capable of performing high-speed AD conversion, high-speed measurement of the beam profiles is possible.

(2) When the beam tuning is performed by using both of the horizontal beam waveprofile and the measurement value of the implantation position beam current as a reference, the beam residual phenomenon does not occurs. Not only the amount of the beam current but also spreading of the beam may be simultaneously tuned, and thus both of these may be tuned with high reproducibility.

(3) Since not only the amount of the beam current but also spreading of the beam may be simultaneously tuned, both of these may be tuned with high reproducibility. Accordingly, the tuning becomes easy.

(4) Due to the adjustment of a beam current to the preset value of the beam current, and the adjustment of the horizontal beam size that is necessary to secure uniformity of the horizontal ion beam density distribution, high precision of the beam current control by the beam measurement and scanning control may be realized.

(5) The ion beam scanned by the beam scanner is measured by the stationary beam profiler (implantation position beam current measuring device 78), and thus a horizontal profile of the scanned ion beam in the horizontal direction (X-direction) that is substantially equivalent to a horizontal profile of a stationary beam in the horizontal direction (X-direction) may be obtained.

(6) A time taken to acquire the horizontal (X-direction) profile that is necessary for the tuning of the ion beam may be greatly shortened compared to the related art.

(7) The optimization of multi-variables, in which it is generally necessary for complex sequences to be combined, is converted into mono-variable by introducing the composed desirability value, and thus tuning of the parameter is possible.

According to this, an ion implantation apparatus in which tuning is easy, and a control method thereof may be provided.

In addition, the simultaneous adjustment of the adjustment of a beam current to the preset value of the beam current and the adjustment of the horizontal beam size, which is performed by the control device, may be simultaneous adjustment in which priority is given to the adjustment of a beam current to the preset value of the beam current or simultaneous adjustment in which priority is given to the adjustment of the horizontal beam size.

The present invention may have the following aspects.

(Aspect 1)

According to an aspect of the present invention, there is provided an ion implantation method for an ion implantation apparatus having a configuration in which reciprocating scanning in a horizontal direction is performed by a beam scanner using an ion beam extracted from an ion source, and the scanned ion beam is parallelized, in which a wafer is moved in a vertical direction by a wafer mechanical scanning device that is controlled by beam measurement feedback, and with regard to the parallelized ion beam, a vertical profile, a horizontal profile, and a two-dimensional shape of the ion beam, and a current density and an integrated current value of the ion beam are measured by a plurality of stationary beam measuring instrument and a movable or stationary beam measuring device.

The beam scanner and the wafer mechanical scanning device are controlled to carry out ion implantation with a set implantation amount for uniformity that is previously set, and adjustment is performed to obtain a desirably optimized beam state by tuning set parameters ((a gas flow rate, an arc current, a filament current, an arc voltage, a cathode voltage, and a cathode current that are adjustment factors of plasma and thermal electrons in the ion source), a position of an extraction electrode, a mass-analyzing magnet unit, first and second beam focusing devices, a beam scanner, a parallel lens (beam parallelizing device), an acceleration and deceleration device, AEF, other electrodes, and the like) of respective portions related to the ion beam, and an ion implantation control is performed to satisfy a set value.

(Aspect 2)

With regard to a distal end of a beam line within a wafer processing chamber of the ion implantation apparatus, a movable or stationary implantation position main measurement cup (an implantation position beam current measuring device) is disposed at an ion implantation position, immediately-in-front-of-implantation-position left and right measurement cups (side cup current measuring instruments) are disposed both left and right sides of an area immediately in front of the ion implantation position, and an implantation-behind-position measurement cup (Faraday cup) is disposed at an area behind the ion implantation position. A beam current value of the scanned ion beam is measured by respective measurement cups of the immediately-in-front-of-implantation-position, the implantation position, and the implantation-behind-position.

(Aspect 3)

Measurement of the beam current value and measurement of the beam profile in a scanning direction are performed by movement measurement of a slit measurement unit of the implantation position main measurement cup in a scanning range of the ion beam.

(Aspect 4)

The movable implantation position main measurement cup (slit measuring unit) is disposed in a stationary manner at an intermediate position of the scanning range, and the measurement of the beam current value of the scanned ion beam and measurement of a beam profile in the scanning direction (horizontal direction or X-direction) are performed.

(Aspect 5)

Adjustment tuning of a beam center is performed by simultaneously measurement by the left and right measurement cups (slit measuring unit) and the implantation position main measurement cup that is disposed in a stationary manner at the intermediate position of the scanning range.

(Aspect 6)

The beam current value, and the X-direction beam width/X-direction profile are simultaneously adjusted by implantation parameter tuning after performing the measurement of the beam current value of the scanned ion beam using the immediately-in-front-of-implantation-position left and right measurement cups and the implantation position main measurement cup (slit measurement unit), and the measurement of the beam profile in the scanning direction using the slit measurement unit of the implantation position beam current measuring device.

(Aspect 7)

Tuning of uniformalizing of the ion beam is performed by profile data of total three points including the center and both sides.

(Aspect 8)

Beam uniformity measurement is performed by a movement measurement of the slit measurement unit of the implantation position main measurement cup in a scanning range of the ion beam.

(Aspect 9)

The scanned ion beam is measured by the slit measurement unit of the movable implantation position main measurement cup while moving across the scanning range in a horizontal direction, and uniformity of horizontal ion beam density distribution of the scanned ion beam is adjusted through a beam control by beam scanning control (adjustment of scanning speed setting).

(Aspect 10)

Measurement of the beam current value, and measurement of the vertical beam profile in a vertical direction orthogonal to the scanning direction of the scanned ion beam are performed by a multi-hole measurement unit of the implantation position main measurement cup in the scanning range of the ion beam.

(Aspect 11)

The X-direction beam width is beam-tuned to a horizontal beam width that is previously set.

(Aspect 12)

A stationary beam current value is measured by the implantation-behind-position measurement cup, and the beam current value is set as an initial beam current reference value of beam current tuning.

(Aspect 13)

Implantation parameter tuning of the scanned ion beam is performed by beam current measurement of the scanned ion beam by the implantation-behind-position measurement cup (tuning Faraday cup), and the scanned ion beam is adjusted so as to obtain a target beam current value.

(Aspect 14)

Implantation parameter tuning of the scanned ion beam is performed by beam current measurement of the scanned ion beam by the implantation-behind-position measurement cup (slit measurement unit), and the beam current value of the scanned ion beam is adjusted so as to obtain a target beam current value.

(Aspect 15)

Measurement of the beam current value of the scanned ion beam in the scanning direction is performed by the immediately-in-front-of-implantation-position left and right measurement cups and the implantation position main measurement cup (slit measurement unit), and the beam current value of the scanned ion beam is adjusted to be a target beam current value at the ion implantation position.

(Aspect 16)

The beam uniformity measurement is performed by the movement measurement of the slit measurement unit of the implantation position main measurement cup (slit measurement unit) in the scanning range of the ion beam, and the scanning of the scanned ion beam is controlled to adjust uniformity of the scanned ion beam.

(Aspect 17)

The beam current value, and the vertical beam width/vertical profile are simultaneously adjusted by the implantation parameter tuning after performing the measurement of the beam current value of the scanned ion beam with the immediately-in-front-of-implantation-position left and right measurement cups and the implantation position main measurement cup (slit measurement unit), and the measurement of the vertical beam profile in the vertical direction of the beam with a multi-hole measurement unit of the implantation position beam current measuring device.

Hereinbefore, description has been made with respect to preferred embodiments of the present invention, but it is needless to say that the present invention is not limited to the above-described embodiments.

What is claimed is:

1. A hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is mechanically moved at a mechanical scanning speed in a vertical direction orthogonal to the horizontal direction, and the mechanical scanning speed is controlled by real time beam measurement feedback to secure uniformity of a vertical ion implantation distribution in the wafer, wherein a vertical profile, a horizontal profile, and an integrated current value of the ion beam are measured by a plurality of stationary beam measuring instruments and a movable or stationary beam measuring device, and the hybrid-type ion implantation apparatus comprises a control device configured to simultaneously perform, at a beam current adjustment stage before ion implantation, adjustment of a beam current to a preset value of the beam current, and adjustment of a horizontal beam size that is necessary to secure the uniformity of the horizontal ion beam density distribution, on the basis of a measurement value of the stationary beam measuring instruments and the movable or stationary beam measuring device.

2. The hybrid-type ion implantation apparatus according to claim 1,
wherein the control device comprises means for giving priority to adjustment of the beam current to the preset value of the beam current during the simultaneous adjustment of the beam current and the adjustment of the horizontal beam size.

3. The hybrid-type ion implantation apparatus according to claim 1,
wherein the control device comprises means for giving priority to adjustment of the horizontal beam size during the simultaneous adjustment the beam current to the preset value and the adjustment of the horizontal beam.

4. A hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is moved at a mechanical scanning speed in a vertical direction orthogonal to a beam scanning direction, and the mechanical scanning speed is controlled by real time beam measurement feedback to secure uniformity of a vertical ion implantation distribution in the wafer,
wherein a vertical profile, a horizontal profile, and an integrated current value of the ion beam are measured by a plurality of stationary beam measuring instruments and a movable or stationary beam measuring device, and
the hybrid-type ion implantation apparatus comprises a control device configured to simultaneously perform, at a beam current adjustment stage before ion implantation, adjustment of a beam current to the preset value of the beam current, and adjustment of a vertical beam profile, on the basis of a measurement value of the stationary beam measuring instruments and the movable or stationary beam measuring device.

5. The hybrid-type ion implantation apparatus according to claim 4,
wherein the control device performs adjustment of the vertical beam profile by a means for adjusting a vertical beam size securing uniformity of the vertical ion implantation distribution in the wafer.

6. The hybrid-type ion implantation apparatus according to claim 5,
wherein the control device comprises means for simultaneously performing the adjustment of the beam current to the preset value and the adjustment of the vertical beam size according to a scanning frequency of the beam scanner and on the basis of the measurement value of the stationary beam measuring instruments and the movable or stationary beam measuring device.

7. The hybrid-type ion implantation apparatus according to claim 5,
wherein the control device comprises means for simultaneously performing the adjustment of the beam current to the preset value of the beam current and the adjustment of the vertical beam size according to the mechanical scanning speed and on the basis of the measurement value of the stationary beam measuring instruments and the movable or stationary beam measuring device.

8. The hybrid-type ion implantation apparatus according to claim 5,
wherein the control device comprises means for simultaneously performing the adjustment of the beam current to the preset value of the beam current and the adjustment of the vertical beam size according to a scanning frequency of the beam scanner and the mechanical scanning speed and on the basis of the measurement value of the stationary beam measuring instruments and the movable or stationary beam measuring device.

9. A hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is moved at a mechanical scanning speed in a vertical direction orthogonal to a beam scanning direction, and the mechanical scanning speed is controlled by real time beam measurement feedback to secure uniformity of a vertical ion implantation distribution in the wafer,
wherein a vertical profile, a horizontal profile, and an integrated current value of the ion beam are measured by a plurality of stationary beam measuring instruments and a movable or stationary beam measuring device, and
the hybrid-type ion implantation apparatus comprises a control device configured to simultaneously perform, at a beam current adjustment stage before ion implantation, adjustment of a beam current to a preset value of the beam current, adjustment of a horizontal beam size that is necessary to secure the uniformity of the horizontal ion beam density distribution, and adjustment of a vertical beam profile, on the basis of a measurement value of the stationary beam measuring instruments and the movable or stationary beam measuring device.

10. The hybrid-type ion implantation apparatus according to claim 9,
wherein the control device performs adjustment of the vertical beam profile by a means for adjusting a vertical beam size securing uniformity of the vertical ion implantation distribution in the wafer.

11. The hybrid-type ion implantation apparatus according to claim 9,
wherein the control device includes means for adjusting the beam current to the preset value of the beam current, means for adjusting the horizontal beam size that is necessary to secure the uniformity of the horizontal ion beam density distribution, means for adjusting the vertical beam profile by adjusting a vertical beam size that is necessary to secure the uniformity of the vertical ion implantation distribution in the wafer, and means for simultaneously operating the means for adjusting the beam current, the means for adjusting the horizontal beam size and the means for adjusting the vertical beam profile.

12. The hybrid-type ion implantation apparatus according to claim 9,
wherein at least one stationary beam measuring instrument among the plurality of stationary beam measuring instruments is a side cup current measuring instrument that is provided in front of or behind an ion implantation position on a beam line on a lateral side of the beam line.

13. The hybrid-type ion implantation apparatus according to claim 12,
wherein at least one stationary beam measuring instrument among the plurality of stationary beam measuring instruments is a side cup current measuring instrument that measures an integrated current value.

14. The hybrid-type ion implantation apparatus according to claim 9,
wherein the movable or stationary beam measuring device is an implantation position beam measuring device provided at an ion implantation position.

15. The hybrid-type ion implantation apparatus according to claim 14,
wherein the implantation position beam measuring includes means for measuring the vertical profile, the horizontal beam current, and the horizontal beam size.

16. The hybrid-type ion implantation apparatus according to claim 9,
wherein the control device includes means for controlling the beam current and the beam profile by introducing an individual desirability value and a composed desirability value.

17. The hybrid-type ion implantation apparatus according to claim 9,
wherein a tuning Faraday cup, which has a function of measuring the entirety of beam currents and measures a final set-up beam at a position behind the ion implantation position, is disposed at the most downstream of a beam line, and
the control device monitors beam waveprofile and beam current signals supplied from the stationary beam measuring instruments, beam waveprofile and beam current signals supplied from the movable or stationary beam measuring device, and beam current signals obtained from the tuning Faraday cup as a reference, converts these signals into one variable using a function of a composed desirability value, and performs parameter tuning.

18. The hybrid-type ion implantation apparatus according to claim 17,
wherein the control device includes means for preparing a plurality of the composed desirability values in accordance with characteristics of a parameter that is subjected to the tuning.

19. The hybrid-type ion implantation apparatus according to claim 17,
wherein the control device is configured to fetch a beam waveprofile that is supplied from the stationary beam measuring instruments and a beam waveprofile that is supplied from the movable or stationary beam measuring device through an AD converter, and
the AD converter converts waveprofile data row (t0, l0), (t1, l1), . . . , (tn, ln) with a type of beam intensity li (i is 0 and a positive integer) at an arbitrary time ti into numerical data that is used for a tuning control, and outputs the numerical data to the control device.

20. The hybrid-type ion implantation apparatus according to claim 19,
wherein the AD converter includes means for converting the waveprofile data into numerical data with respect to a beam width that is m % (m is a value determined in advance) of a total integrated value of beam intensity, beam peak intensity, the total integrated value of beam intensity, and a standard deviation of a beam intensity distribution.

21. The hybrid-type ion implantation apparatus according to claim 19,
wherein the control device includes means for processing the beam waveprofile data, which is fetched through the AD converter, using a tracking task that simultaneously performs a plurality of input controls.

22. The hybrid-type ion implantation apparatus according to claim 21,
wherein in the tracking task, the means for processing includes means for calculating the composed desirability value using a calculation expression that is determined in advance, and sets a calculation result in a table capable of being referenced commonly in the control device.

23. The hybrid-type ion implantation apparatus according to claim 16,
wherein the control device includes means for generating a calculation expression in order for all variables to satisfy a specified limit when the composed desirability value becomes a set value.

24. The hybrid-type ion implantation apparatus according to claim 16,
wherein the control device includes means for setting, when taking one response to be optimized at the horizontal axis, an upper limit standard value and a lower limit standard value that satisfy the response, and for setting the individual desirability value to a trapezoidal function form in order for the individual desirability value to be a set value when the response enters between the upper limit standard value and the lower limit standard value.

25. The hybrid-type ion implantation apparatus according to claim 24,
wherein the means for controlling uses the following expression as a composed desirability value D, $$D = \alpha_1 \cdot d_1^{\beta_1} + \alpha_2 \cdot d_2^{\beta_2} + \ldots + \alpha_n \cdot d_n^{\beta_n}$$

where $\beta_n$ represents a coefficient indicating strictness with respect to the upper limit standard value and the lower limit standard value, $\alpha_n$ represents a weight of the individual desirability value, and weight $\alpha$ is set to satisfy the following Expression (3)

$$\sum_{i=1}^{n} \alpha_i = 1. \tag{3}$$

26. The hybrid-type ion implantation apparatus according to claim 25, wherein
the control device includes means for determining, when a value of the composed desirability value D becomes a set value, that all responses enter within the upper limit standard value and the lower limit standard value, and for thereafter completing the tuning.

27. The hybrid-type ion implantation apparatus according to claim 16,
wherein the control device means for obtaining a desirably optimized beam with respect to a set target value by tuning a value of each element of various device parameters in order for one variable value that is set to be maximum.

28. The hybrid-type ion implantation apparatus according to claim 27,
wherein the means for obtaining the desirably optimized beam tunes the values of the elements of various device parameters in the ion source including values of a gas flow rate, an arc current, a filament current, an arc voltage, a cathode voltage, and a cathode current that are adjustment factors of plasma and thermal electrons.

29. The hybrid-type ion implantation apparatus according to claim 27,
wherein the means for obtaining the desirably optimized beam tunes the values of the elements of various device parameters in each element of the beam line downstream of the ion source including values of a position of an extraction electrode that extracts the ion beam from the ion source, and respective currents or voltages of the mass-analyzing magnet unit, an X-steerer, a beam focusing lens, the beam scanner, a beam parallelizing lens, an acceleration and deceleration device, an angular energy filter, and other electrodes.

30. The hybrid-type ion implantation apparatus according to claim 9,
at least one stationary beam measuring instrument among the plurality of stationary beam measuring instruments is by a tuning Faraday cup measuring the entirety of beam currents, measuring the scanned ion beam at a position behind the ion implantation position and being a means for determining the integrated current value.

31. A control method of a hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is moved at a mechanical scanning speed in a vertical direction orthogonal to a beam scanning direction, and the mechanical scanning speed is controlled by real time beam measurement feedback to secure uniformity of a vertical ion implantation distribution in the wafer,
wherein a vertical profile, a horizontal profile, and an integrated current value of the ion beam are measured by a plurality of stationary beam measuring instruments and a movable or stationary beam measuring device, and
at a beam current adjustment stage before ion implantation, adjustment of a beam current to a preset value of the beam current, and adjustment of a horizontal beam size that is necessary to secure the uniformity of the horizontal ion beam density distribution are simultaneously performed on the basis of a measurement value of the stationary beam measuring instruments and the movable or stationary beam measuring device.

32. A control method of a hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is moved at a mechanical scanning speed in a vertical direction orthogonal to a beam scanning direction, and the mechanical scanning speed is controlled by real time beam measurement feedback to secure uniformity of a vertical ion implantation distribution in the wafer,
wherein a vertical profile, a horizontal profile, and an integrated current value of the ion beam are measured by a plurality of stationary beam measuring instruments and a movable or stationary beam measuring device, and
at a beam current adjustment stage before ion implantation, adjustment of a beam current to a preset value of the beam current, and adjustment of a vertical beam profile are simultaneously performed on the basis of a measurement value of the stationary beam measuring instruments and the movable or stationary beam measuring device.

33. The control method of a hybrid-type ion implantation apparatus according to claim 32,
wherein adjustment of a vertical beam size that is necessary to secure the uniformity of the vertical ion implantation distribution in the wafer is performed as the adjustment of the vertical beam profile.

34. A control method of a hybrid-type ion implantation apparatus having a configuration in which reciprocating scanning in a horizontal direction is performed by a beam scanner using an ion beam extracted from an ion source, and the scanned ion beam is parallelized, in which uniformity in a horizontal ion beam density distribution of the parallelized ion beam is controlled by adjustment of a scanning speed of the beam scanner and is secured, and in which a wafer is moved at a mechanical scanning speed in a vertical direction orthogonal to a beam scanning direction, and the mechanical scanning speed is controlled by real time beam measurement feedback to secure uniformity of a vertical ion implantation distribution in the wafer,
wherein a vertical profile, a horizontal profile, and an integrated current value of the ion beam are measured by a plurality of stationary beam measuring instruments and a movable or stationary beam measuring device, and
at a beam current adjustment stage before ion implantation, adjustment of a beam current to a preset value of the beam current, adjustment of a horizontal beam size to secure uniformity of the horizontal ion beam density, and adjustment of a vertical beam size to secure the uniformity of the vertical ion implantation distribution are simultaneously performed on the basis of a measurement value of the stationary beam measuring instruments and the movable or stationary beam measuring device.

* * * * *